(12) United States Patent
Ko et al.

(10) Patent No.: US 12,444,362 B2
(45) Date of Patent: Oct. 14, 2025

(54) DISPLAY PANEL COMPRISING PLURALITY OF DISPLAY AREAS AND DISPLAY APPARATUS INCLUDING THE SAME

(71) Applicant: LG Display Co., Ltd., Seoul (KR)

(72) Inventors: Intae Ko, Daegu (KR); SangMoo Song, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/638,172

(22) Filed: Apr. 17, 2024

(65) Prior Publication Data

US 2024/0363068 A1 Oct. 31, 2024

(30) Foreign Application Priority Data

Apr. 27, 2023 (KR) .......................... 10-2023-0055440

(51) Int. Cl.
*G09G 3/3233* (2016.01)
*B60K 35/00* (2024.01)
*B60K 35/28* (2024.01)
*H10K 59/131* (2023.01)
*H10K 59/80* (2023.01)

(52) U.S. Cl.
CPC ......... *G09G 3/3233* (2013.01); *H10K 59/131* (2023.02); *G09G 2300/0413* (2013.01); *G09G 2300/0452* (2013.01); *G09G 2300/0842* (2013.01); *G09G 2320/068* (2013.01); *G09G 2380/10* (2013.01)

(58) Field of Classification Search
CPC .... G09G 3/3233; G09G 3/3291; H10K 59/80; H10K 59/131; B60K 35/00; B60K 35/21; B60K 35/231; B60K 35/234; B60K 35/28
See application file for complete search history.

(56) References Cited

U.S. PATENT DOCUMENTS

| | | | |
|---|---|---|---|
| 2015/0048333 A1* | 2/2015 | Choi .................... | H10K 59/879 257/40 |
| 2017/0330531 A1* | 11/2017 | Yamazaki ............. | B60K 37/20 |
| 2017/0365217 A1* | 12/2017 | An ....................... | G09G 3/3258 |
| 2021/0273203 A1* | 9/2021 | Sano .................... | H10K 59/352 |
| 2021/0327362 A1* | 10/2021 | Park .................... | H10K 59/123 |

FOREIGN PATENT DOCUMENTS

KR 10-2016-0023268 A 3/2016

* cited by examiner

*Primary Examiner* — Sardis F Azongha
(74) *Attorney, Agent, or Firm* — Fenwick & West LLP

(57) ABSTRACT

A display apparatus includes a first area including a first display area having a first size, a second area including a second display area having a second size, a low potential line at least partially surrounding outer peripheries of the first area and the second area and between the first area and the second area in a plan view of the display apparatus, the low potential line supplying a low potential power voltage to a pixel circuit included in each of the first area and the second area, and a cover glass on the first area, the low potential line, and the second area.

30 Claims, 12 Drawing Sheets

DISPLAY PANEL COMPRISING PLURALITY OF DISPLAY AREAS AND DISPLAY APPARATUS INCLUDING THE SAME

CROSS-REFERENCE TO RELATED APPLICATIONS

This application claims the priority of Republic of Korea Patent Application No. 10-2023-0055440 filed on Apr. 27, 2023, in the Korean Intellectual Property Office, which is hereby incorporated by reference in its entirety.

BACKGROUND

Field

The present disclosure relates to a display panel comprising a plurality of display areas and a display apparatus including the same.

Description of the Related Art

As technology in modern society develops, display apparatuses are used in various ways to provide information to users. The display apparatuses include not only electronic signs which simply transmit visual information in one direction, but also various electronic devices which require higher level of technology to check user's input and provide information in response to the checked input. A display apparatus is included in a vehicle to provide various information to a driver and passengers of the vehicle.

However, the display apparatus of the vehicle needs to appropriately display content without interrupting the operation of the vehicle. For example, the display apparatus needs to limit the display of the content which may reduce the concentration on the driving while the vehicle is in operation.

SUMMARY

An object to be achieved by the exemplary embodiment of the present disclosure is to provide a display apparatus and a display panel with improved usability by improving visibility between a plurality of display areas in a display apparatus which provides different content.

Objects of the present disclosure are not limited to the above-mentioned objects, and other objects, which are not mentioned above, can be clearly understood by those skilled in the art from the following descriptions.

According to one embodiment of the present disclosure, a display apparatus comprises: a first area including a first display area having a first size; a second area including a second display area having a second size; a low potential line at least partially surrounding outer peripheries of the first area and the second area and between the first area and the second area in a plan view of the display apparatus, the low potential line supplying a low potential power voltage to a pixel circuit included in each of the first area and the second area that is less than a high potential power voltage supplied to the pixel circuit; and a cover glass on the first area, the low potential line, and the second area.

According to one embodiment of the present disclosure, a display apparatus comprises: a first display area having a first size, the first display area having a first pixel including a first light emitting element; a second display area having a second size that is larger than the first size, the second display area having a second pixel including a second light emitting element and a third light emitting element; a first lens overlapping the first light emitting element in the first display area and a second lens overlapping the second light emitting element in the second display area, the first lens and the second lens having a first shape; a third lens overlapping the third light emitting element that is included in the second pixel in the second display area, the third lens having a second shape that is different from the first shape; and a low potential line between the first display area and the second display area in a plan view of the display apparatus, the low potential line supplying a low potential power voltage to the first pixel in the first display area and the second pixel in the second display area that is less than a high potential power voltage supplied to the first pixel and the second pixel. includes a first area which includes a first display area with a first size, a second area which includes a second display area with a second size; and a low potential line which is disposed at outer peripheries of the first area and the second area and between the first area and the second area and supplies a low potential power voltage to a pixel circuit included in each of the first area and the second area, and a cover glass is disposed on the first area, the low potential line, and the second area.

Other detailed matters of the exemplary embodiments are included in the detailed description and the drawings.

According to the present disclosure, the display apparatus and the display panel improve the usability by improving visibility between a plurality of display areas in a display apparatus including a plurality of display areas which provides different contents.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
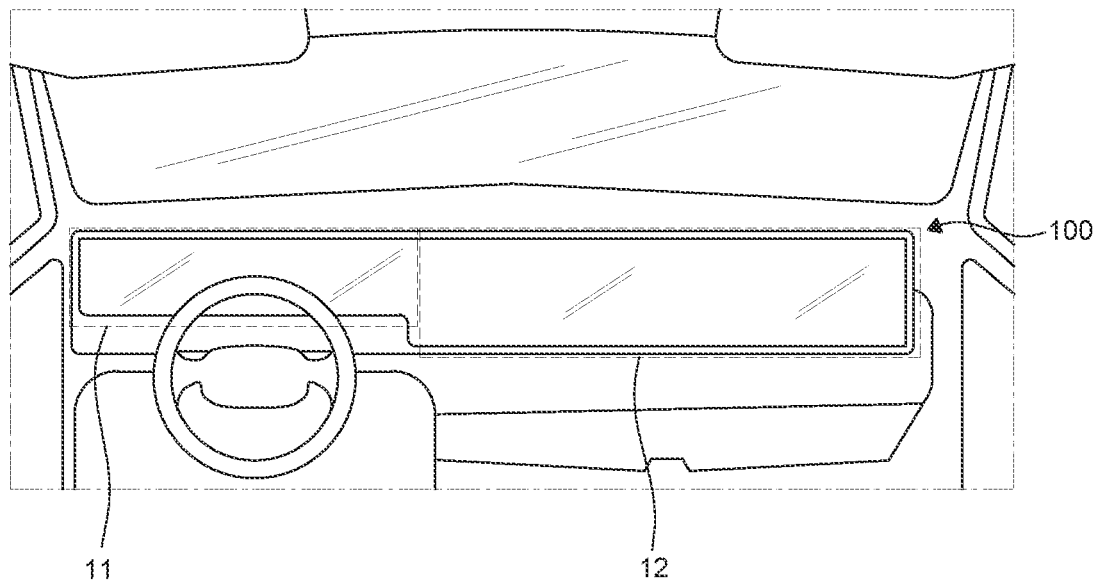
FIG. 1 is an example of a display apparatus according to an exemplary embodiment of the present disclosure.

Terms used in exemplary embodiments are selected from general terms which are currently and widely used as much as possible while considering a function in the present disclosure, but the terminologies may vary in accordance with the intention of those skilled in the art, custom, or appearance of new technology. Further, in particular cases, the terms are arbitrarily selected by an applicant and in this case, the meaning thereof may be described in a corresponding section of the description of the disclosure in detail. Therefore, the term used in the present disclosure needs to be defined based on a substantial meaning of the term and the specification rather than a simple title of the term.

In the entire specification, unless explicitly described to the contrary, the word "comprise" and variations such as "comprises" or "comprising", will be understood to imply the inclusion of stated elements but not the exclusion of any other elements.

The expression "at least one of a, b, and c" described throughout this specification may include 'a alone', 'b alone', 'c alone', 'a and b', 'a and c', 'b and c', or 'all a, b, and c'. Advantages and characteristics of the present disclosure and a method of achieving the advantages and characteristics will be clear by referring to exemplary embodiments described below in detail together with the accompanying drawings.

The shapes, sizes, ratios, angles, numbers, and the like illustrated in the accompanying drawings for describing the exemplary embodiments of the present disclosure are merely examples, and the present disclosure is not limited thereto. In description of an example embodiment, if it is determined that detailed description for a related art may unnecessarily obscure the gist of the example embodiment, the detailed description will be omitted.

The terminologies such as "including," "having," and "comprising" used herein are generally intended to allow other components to be added. Any references to singular may include plural unless expressly stated otherwise. Components are interpreted to include an ordinary error range even if not expressly stated.

When the position relation between two parts is described using the terms such as "on", "above", "below", and "next", one or more parts may be positioned between the two parts. When an element or layer is disposed "on" other element or layer, another layer or another element may be interposed directly on the other element or therebetween.

Although the terms such as "first" or "second" are used for describing various components, these components are not confined by these terms. These terms are merely used for distinguishing one component from the other components. Therefore, a first component to be mentioned below may be a second component in a technical concept of the present disclosure.

An area, a length, or a thickness of each component described in the specification are illustrated for convenience of description, and the present disclosure is not necessarily limited to the area and the thickness of the component illustrated.

The features of various embodiments of the present disclosure may be partially or entirely bonded to or combined with each other and may be interlocked and operated in technically various ways, and the embodiments may be carried out independently of or in association with each other.

Terms to be described below are terms which are defined in consideration of the function in the exemplary embodiment of the present specification. Therefore, the terms may vary depending on intentions of users or operators or customs. Accordingly, the term needs to be defined on the basis of the contents throughout this specification.

A transistor which configures a pixel circuit of the present disclosure may include at least one or more of oxide thin film transistor (oxide TFT), amorphous silicon TFT (a-Si TFT), and a low temperature poly silicon (LTPS) TFT.

The following exemplary embodiments will be described with respect to an organic light emitting display apparatus. However, the exemplary embodiments of the present disclosure are not limited to the organic light emitting display apparatus but may also be applied to an inorganic light emitting display apparatus including an inorganic light emitting material. For example, the exemplary embodiments of the present disclosure may be applied to a quantum dot display apparatus.

Expressions such as "first", "second", and "third" are terms used to distinguish configurations for every exemplary embodiment, but the exemplary embodiments are not limited by these terms. Therefore, it should be noted that the same term may refer to different configurations depending on the exemplary embodiment.

Hereinafter, exemplary embodiments of the present disclosure will be described with reference to the drawings.

FIG. 1 is an example of a display apparatus according to an exemplary embodiment of the present disclosure.

FIG. 1 illustrates an example that a display apparatus (or a display panel) 100 is disposed in a vehicle 1.

Referring to FIG. 1, the display apparatus 100 may be disposed in at least a part of a dashboard of the vehicle 1. The dashboard of the vehicle 1 includes configurations disposed on a front surface of front seats (for example, a driver seat and a front passenger seat) of the vehicle 1. For example, on the dashboard of the vehicle 1, an input configuration for manipulating various functions (for example, an air-conditioner, an audio system, or a navigation system) in the vehicle 1 may be disposed.

In the exemplary embodiment, the display apparatus 100 is disposed on the dashboard of the vehicle 1 to operate as an input unit which manipulates at least a part of various functions of the vehicle 1. The display apparatus 100 may provide various information related to the vehicle 1, for example, operation information of the vehicle (for example, a current speed of the vehicle, a remaining fuel amount, or a mileage) or information about parts of the vehicle (for example, a damage level of a vehicle tire).

In an exemplary embodiment, the display apparatus 100 may be disposed across the driver seat and the front passenger seat disposed in the front seats of the vehicle 1. For example, as illustrated in the drawing, the display apparatus 100 is disposed to horizontally extend from a part of the driver seat in which a steering wheel is disposed to the front passenger seat. In this case, a part adjacent to the driver seat is referred to as a first area 11 and a part adjacent to the front passenger seat may be referred to as a second area 12.

In the exemplary embodiment, in the first area 11, content different from the second area 12 may be displayed. For example, in the first area 11, various content for driving may be disposed (e.g., a first type of content). For example, vehicle attributes including at least one of the current speed, the mileage, a vehicle status, a remaining fuel amount, and a current status of a vehicle indicator light may be displayed. In the second area 12, various types of content including entertainment contents (e.g., second type of content) may be displayed. For example, in the second area 12, at least one of a vehicle environment control button, game content, video content, and messenger content may be disposed.

In the exemplary embodiment, the first area 11 and the second area 12 may have different sizes. For example, the first area 11 may be smaller than the second area 12. The first area 11 has a size corresponding to the driver seat (e.g., the driver seat width) and the second area 12 has a size corresponding to an area other than the driver seat, for example, the width of the front passenger seat and a width of a sharing area between the driver seat and the front passenger seat. As another example, a height (or a vertical length) of the first area 11 may be shorter than a height of the second area 12. A width (or a horizontal length) of the first area 11 may be shorter than a width of the second area 12. However, the exemplary embodiment of the present disclosure is not limited to the example.

Figure 2:
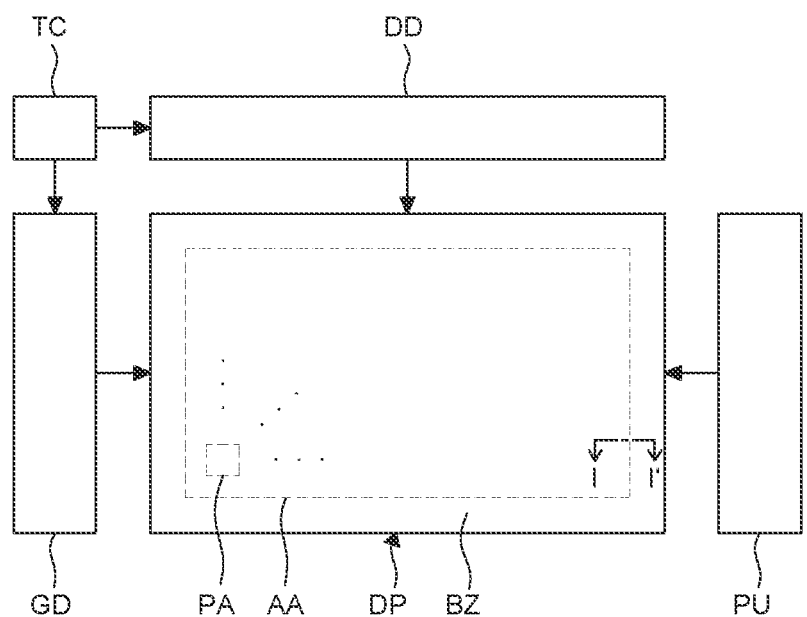
FIG. 2 is a functional block diagram of a display apparatus according to an exemplary embodiment of the present disclosure.

FIG. 2 is a functional block diagram of a display apparatus according to an exemplary embodiment of the present disclosure.

Referring to FIG. 2, a display apparatus (for example, the display apparatus 100 of FIG. 1) may include a display panel DP, a data driving circuit (or a data driver) DD, a gate driving circuit (or a gate driver) GD, a timing controller TC, and a power unit PU.

In the exemplary embodiment, the display panel DP may generate images to be provided to the user. For example, the display panel DP may generate and display images to be provided to the user through a pixel area PA in which the pixel circuit is disposed.

The data driving circuit DD, the gate driving circuit GD, the timing controller TC, and the power unit PU may provide signals for operations of the pixel areas PA through signal lines. The signal lines, for example, may include data lines DL, gate lines GL, and power voltage supply lines PL illustrated in FIG. 3.

Figure 3:
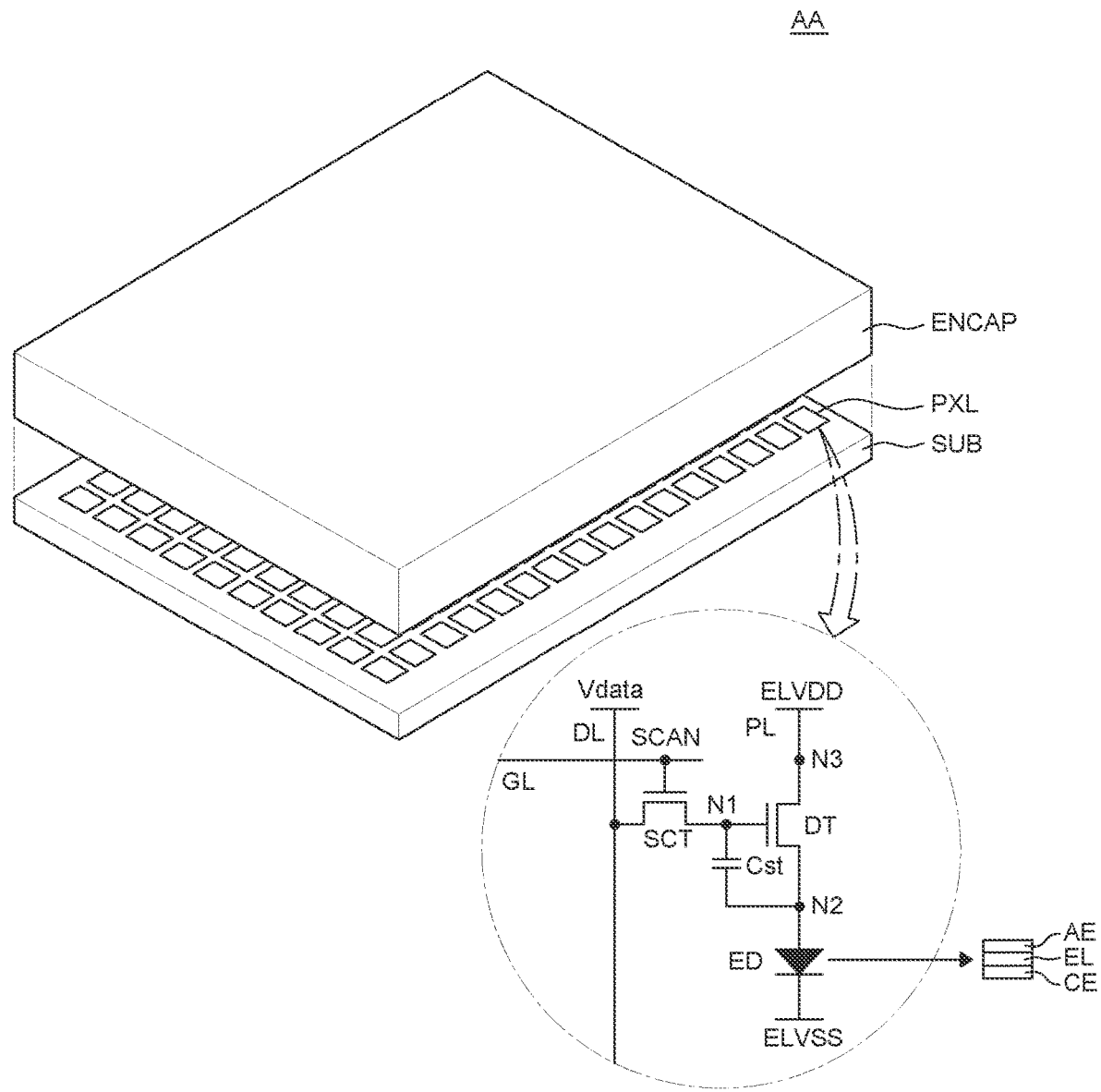
FIG. 3 is an example of a pixel circuit of a display apparatus according to an exemplary embodiment of the present disclosure.

For example, the data driving circuit DD applies a data signal to each pixel area PA through the data lines DL of FIG. 3. The gate driving circuit GD applies a gate signal to each pixel area PA through the gate lines GL. The power unit PU may supply a power voltage to each pixel area PA through the power voltage supply lines PL.

The timing controller TC may control the data driving circuit DD and the gate driving circuit GD. For example, the timing controller TC rearranges digital video data input from the outside in accordance with a resolution of the display panel DP to supply the digital video data to the data driving circuit DD.

The data driving circuit DD converts digital video data input from the timing controller TC into an analog data voltage based on the data control signal to supply the converted analog data voltage to the plurality of data lines.

The gate driving circuit GD may generate a scan signal and an emission signal (or an emission control signal) based on the gate control signal. The gate driving circuit GD may include a scan driver and an emission signal driver. The scan driver generates a scan signal in a row sequential manner to drive at least one scan line connected to each pixel row to supply the scan signal to the scan lines. The emission signal driver generates an emission signal in a row sequential manner to drive at least one emission signal line connected to each pixel row to supply the emission signal to the emission signal lines.

According to the exemplary embodiment, the gate driving circuit GD may be disposed in the display panel DP in a gate-driver in panel (GIP) manner. For example, the gate driving circuit GD is divided into a plurality of circuits to be disposed on at least two side surfaces of the display panel DP.

The display area AA of the display panel DP may include a plurality of pixel areas (or pixels or pixel circuits) PA. In the pixel area PA, a plurality of data lines (for example, data lines of FIG. 3) and a plurality of gate lines (for example, gate lines GL of FIG. 3) intersect and sub pixels are disposed at intersecting areas. The sub pixels included in one pixel area PA may emit different color light. For example, the pixel area PA uses three sub pixels to implement blue, red, and green. However, this is not limited thereto, and, in some cases, the pixel area PA may further include a sub pixel for further implementing a specific color (for example, white).

In the exemplary embodiment, the display area AA may include a plurality of display areas. The plurality of display areas may have different sizes. For example, the plurality of display areas includes a first display area and a second display area, the first display area may be smaller than the second display area. A more specific example related thereto will be described with reference to FIG. 8.

In the pixel area PA, an area which implements blue is referred to as a blue sub pixel area, an area which implements red is referred to as a red sub pixel area, and an area which implements green is referred to as a green sub pixel area.

In the exemplary embodiment, the pixel area PA may include a plurality of sub pixels. Each of the plurality of sub pixels may be divided into a first lens area and a second lens area which provide different viewing angles. For example, the pixel area PA may include a first lens area which supplies light in a first range to form a first viewing angle and a second lens area which supplies light in a second range to form a second viewing angle. The first range may be wider than the second range.

The non-display area BZ may be disposed around the display area AA. Various components for driving the pixel circuit disposed in the display area AA may be disposed in the non-display area BZ. For example, at least a part of the gate driving circuit GD may be disposed in the non-display area BZ. The non-display area BZ may be referred to as a bezel area.

FIG. 3 is an example of a pixel circuit of a display apparatus according to an exemplary embodiment of the present disclosure.

The pixel area PA may include a plurality of sub pixels PXL representing different colors and pixel circuits corresponding to the plurality of sub pixels PXL. FIG. 3 enlarges an example of a pixel circuit for one sub pixel PXL disposed in the pixel area PA.

Referring to FIG. 3, the sub pixel PXL may be disposed on the substrate SUB. An encapsulation layer ENCAP may be disposed on the sub pixel PXL. The sub pixel PXL may include the pixel circuit. The pixel circuit may include a driving transistor DT, a switching transistor SCT, a capacitor (or a storage capacitor) Cst, and a light emitting diode ED.

The driving transistor DT and the capacitor Cst may be connected to the switching transistor SCT. A first electrode of the driving transistor DT may be connected to a power voltage supply line PL at a third node N3.

The switching transistor SCT is connected to the gate line GL to be supplied with a gate signal. The switching transistor SCT may be turned on or turned off by the gate signal. A first electrode of the switching transistor SCT may be connected to a gate electrode of the driving transistor DT at the first node N1. A second electrode of the switching transistor SCT is connected to the data line DL and a gate electrode may be connected to the gate line GL. In this case, as the switching transistor SCT is turned on, the data signal may be supplied to the gate electrode of the driving transistor DT through the switching transistor SCT.

The capacitor Cst may be disposed between the gate electrode and the second electrode of the driving transistor DT. The capacitor Cst may maintain a signal applied to the gate electrode of the driving transistor DT, for example, a data signal, for one frame.

Transistors DT and SCT of FIG. 3 may include at least one of oxide semiconductors such as amorphous silicon, polycrystalline silicon, and IGZO. The first electrodes or the second electrodes of the transistors DT and SCT may be source electrodes or drain electrodes. For example, the first electrode is the source electrode, and the second electrode may be the drain electrode. As another example, the first electrode is the drain electrode, and the second electrode may be the source electrode.

Figure 4:
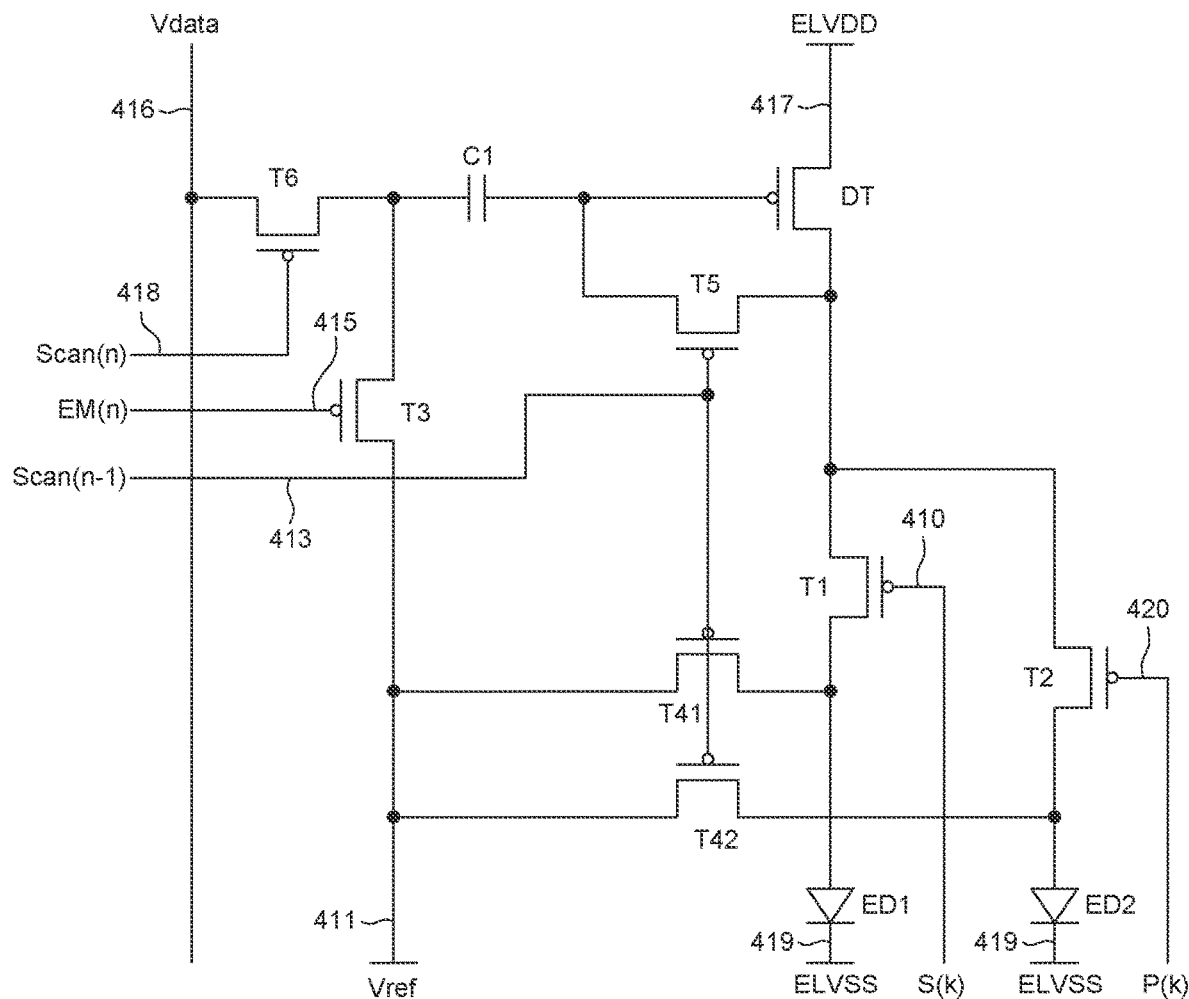
FIG. 4 is another example of a pixel circuit of a display apparatus according to an exemplary embodiment of the present disclosure.

FIG. 4 is another example of a pixel circuit of a display apparatus according to an exemplary embodiment of the present disclosure.

FIG. 4 illustrates an example that the pixel circuit 400 comprises a plurality of light emitting diodes ED1 and ED2.

Referring to FIG. 4, the pixel circuit 400 may include eight transistors T1, T2, T3, T41, T42, T5, T6, and DT and one capacitor C1. At least some of eight transistors T1, T2, T3, T41, T42, T5, T6, and DT included in the pixel circuit 400 may be an n-type transistor or a p-type transistor. In the case of the p-type transistor, a low level voltage of each driving signal refers to a voltage which turns on the TFTs and a high level voltage of each driving signal refers to a voltage which turns off the TFTs.

Here, the low-level voltage may correspond to a predetermined voltage which is less than the high-level voltage. For example, the low-level voltage may include a voltage corresponding to a range of −8 V to −12 V. The high-level voltage is a predetermined voltage which is greater than the low-level voltage. For example, the high-level voltage may include a voltage corresponding to the range of 6 V to 8 V. According to the exemplary embodiment, the low-level voltage is referred to as a first voltage and the high-level voltage is referred to as a second voltage. In this case, the first voltage may be less than the second voltage.

First electrodes or second electrodes of the transistors T1, T2, T3, T41, T42, T5, T6, and DT to be described below may refer to source electrodes or drain electrodes. However, the terms of the first electrode and the second electrode are terms for distinguishing the electrodes, but do not limit what corresponds to each electrode. Further, in each electrode, the first electrode does not refer to the same electrode. For example, the first electrode of the first transistor T1 refers to the source electrode of the first transistor T1 and the first electrode of the sixth transistor T6 may refer to the drain electrode of the sixth transistor T6.

In the exemplary embodiment, the driving transistor DT may be connected to the first transistor T1 connected to the first light emitting diode ED1 and the second transistor T2 connected to the second light emitting diode ED2. For example, the second electrode of the driving transistor DT may be connected to the first transistor T1 and the second transistor T2.

In the exemplary embodiment, the driving transistor DT may be connected to a first power line 417 which supplies a high potential power voltage ELVDD. For example, the first electrode of the driving transistor DT may be connected to the first power line 417. When the driving transistor DT is turned on, the high potential power voltage ELVDD supplied through the first power line 417 is transmitted from the first electrode to the second electrode of the driving transistor DT.

In one exemplary embodiment, the first transistor T1 may be connected to at least one of the first light emitting diode ED1, the second transistor T2, a 4-1-th transistor T41, a fifth transistor T5, and the driving transistor DT.

In one exemplary embodiment, the first electrode of the first transistor T1 may be connected to at least one of the driving transistor DT, the second transistor T2, and the fifth transistor T5. The second electrode of the first transistor T1 may be connected to at least one of the 4-1-th transistor T41 and the first light emitting diode ED1. The gate electrode of the first transistor T1 may be connected to a first control line 410. The first transistor T1 may be turned on or off by a first control signal S (k) supplied through the first control line 410. When the first transistor T1 is turned on, the voltage through the driving transistor DT may be input to the first light emitting diode ED1 (for example, an anode electrode of the first light emitting diode ED1).

Here, the first control signal S (k) may include a k-th first control signal which is supplied to a k-th column in response to the pixel circuit 400 which is disposed in a k-th (k is a positive integer) column. The first control signal S (k) is supplied by a mode controller and may control the driving (or emission) of the first light emitting diode ED1 in which the first lens is disposed.

In one exemplary embodiment, the second transistor T2 may be connected to at least one of the second light emitting diode ED2, the first transistor T1, the third transistor T3, a 4-2-th transistor T42, and the driving transistor DT.

In one exemplary embodiment, the first electrode of the second transistor T2 may be connected to at least one of the driving transistor DT, the first transistor T1, and the fifth transistor T5. The second electrode of the second transistor T2 may be connected to at least one of the second light emitting diode ED2 and the 4-2-th transistor T42. The gate electrode of the second transistor T2 may be connected to a second control line 420. The second transistor T2 may be turned on or off by a second control signal P (k) supplied through the second control line 420. When the second transistor T2 is turned on, the voltage through the driving transistor DT may be input to the second light emitting diode ED2 (for example, an anode electrode of the second light emitting diode ED2).

In the exemplary embodiment, each of the first light emitting diode ED1 and the second light emitting diode ED2 may include a light emitting diode. For example, each of the first light emitting diode ED1 and the second light emitting diode ED2 may be configured by an organic light emitting diode.

Here, the second control signal P (k) may include a k-th second control signal which is supplied to a k-th column in response to the pixel circuit 400 which is disposed in a k-th column. The second control signal P (k) is supplied by the mode controller and may control the driving (or emission) of the second light emitting diode ED2 in which the second lens is disposed.

In one exemplary embodiment, the first lens may be disposed on the first light emitting diode ED1. A viewing angle of the area in which the first light emitting diode ED1 is disposed may correspond to a first value by the first lens. For example, the viewing angle of the area in which the first light emitting diode ED1 is disposed may be equal to or larger than the first value. The second lens may be disposed on the second light emitting diode ED2. A viewing angle of the area in which the second light emitting diode ED2 is disposed may correspond to a second value by the second lens. The second value may be smaller than the first value. For example, the viewing angle of the area in which the second light emitting diode ED2 is disposed may be equal to or smaller than the second value.

In one exemplary embodiment, when it is assumed that the pixel circuit 400 is disposed to be adjacent to the front passenger seat, the area in which the first light emitting diode ED1 of the pixel circuit 400 is disposed may have a viewing angle of a first value which supplies light to a range corresponding to the front passenger seat and the driver seat next to the front passenger seat. The area in which the second light emitting diode ED2 is disposed may have a viewing of a second value to supply light to a range corresponding to the front passenger seat.

In one exemplary embodiment, the first light emitting diode ED1 or the second light emitting diode ED2 may be connected to another configuration of the pixel circuit, for example, the driving transistor DT according to a mode. The mode is specified by the user's input or determined when a predetermined condition is satisfied. For example, when a predetermined first condition is satisfied, the first light emitting diode ED1 may emit light as the first control signal S (k) is supplied. When a predetermined second condition is satisfied, the second light emitting diode ED2 may emit light as the second control signal P (k) is supplied. The first condition may include a condition which is specified in advance to be driven in a first mode. The second condition may include a condition which is specified in advance to be driven in a second mode.

In one exemplary embodiment, the third transistor T3 may be connected to at least one of a 4-1-th transistor T41, a 4-2-th transistor T42, a sixth transistor T6, and a capacitor C1. For example, the first electrode of the third transistor T3 may be connected to the sixth transistor T6 and the capacitor C1. The second electrode of the third transistor T3 may be connected to the 4-1-th transistor T41 and the 4-2-th transistor T42. The gate electrode of the third transistor T3 may be connected to the emission signal line 415 which supplies the emission signal EM (n). The emission signal EM (n) may correspond to an n-th emission signal EM (n) supplied to an n-th row as the pixel circuit 400 is disposed in an n-th (n is a positive integer) pixel row. The third transistor T3 may be turned on or off by the emission signal EM (n). The second electrode of the third transistor T3 may be connected to the reference voltage line 411 which supplies a reference voltage Vref.

In the exemplary embodiment, the 4-1-th transistor T41 may be connected to at least one of the first transistor T1, the third transistor T3, and the first light emitting diode ED1. For example, the first electrode of the 4-1-th transistor T41 may be connected to the third transistor T3. The second electrode of the 4-1-th transistor T41 may be connected to the first transistor T1 and the first light emitting diode ED1. The gate electrode of the 4-1-th transistor T41 may be connected to a n-1-th scan line 413. Therefore, the 4-1-th transistor T41 may be supplied with a n-1-th scan signal Scan (n-1) and may be turned on or off by the n-1-th scan signal Scan (n-1).

In the exemplary embodiment, the 4-2-th transistor T42 may be connected to at least one of the second transistor T2, the third transistor T3, and the second light emitting diode ED2. For example, the first electrode of the 4-2-th transistor T42 may be connected to the third transistor T3. The second electrode of the 4-2-th transistor T42 may be connected to the second transistor T2 and the second light emitting diode ED2. The gate electrode of the 4-2-th transistor T42 may be connected to the n-1-th scan line 413. Therefore, the 4-2-th transistor T42 may be supplied with a n-1-th scan signal Scan (n-1) and may be turned on or off by the n-1-th scan signal Scan (n-1).

In the exemplary embodiment, the fifth transistor T5 may be connected to at least one of the driving transistor DT, the 4-1-th transistor T41, the 4-2-th transistor T42, the capacitor C1, the first transistor T1, and the second transistor T2. For example, the first electrode of the fourth transistor T4 may be connected to the driving transistor DT and the capacitor C1. The second electrode of the fifth transistor T5 may be connected to the driving transistor DT, the first transistor T1, and the second transistor T2. The gate electrode of the fifth transistor T5 may be connected to the n-1-th scan line 413 which supplies the scan signal Scan in the n-1-th row. The fifth transistor T5 may be supplied with the n-1-th scan signal Scan (n-1) and may be turned on or off by the n-1-th scan signal Scan (n-1).

In the exemplary embodiment, the sixth transistor T6 may be connected to at least one of the third transistor T3 and the capacitor C1. For example, the first electrode of the sixth transistor T6 may be connected to the third transistor T3 and the capacitor C1. The second electrode of the sixth transistor T6 may be connected to the data line 416 which supplies a data voltage Vdata. The gate electrode of the sixth transistor T6 may be connected to the n-th scan line 418 which supplies the n-th scan signal Scan (n). The sixth transistor T6 is supplied with the n-th scan signal Scan (n) and may be turned on or off by the n-th scan signal Scan (n). When the sixth transistor T6 is turned on, the data voltage Vdata may be transmitted from the second electrode to the first electrode.

In the exemplary embodiment, the first light emitting diode ED1 and/or the second light emitting diode ED2 may be connected to the fourth power line 419 which supplies a low potential power voltage ELVSS. For example, the cathode electrode of the first light emitting diode ED1 and the cathode electrode of the second light emitting diode ED2 are connected to the third power line 419 to be supplied with the low potential power voltage ELVSS.

According to the exemplary embodiment, the low potential power voltage may include a ground (or a ground voltage, 0 V). For example, the cathode electrode of the first light emitting diode ED1 and the cathode electrode of the second light emitting diode ED2 may be supplied with a voltage corresponding to the ground.

According to the exemplary embodiment, the pixel circuit 400 may further include a seventh transistor. For example, the pixel circuit 400 may include the seventh transistor disposed between a node to which the driving transistor DT and the fifth transistor T5 are connected and a node to which the first transistor T1 and the second transistor T2 are connected. The gate electrode of the seventh transistor may be connected to the emission signal line 415 which supplies the emission signal EM (n). The seventh transistor may be turned on or off based on the emission signal EM (n). When the seventh transistor is turned on, a voltage (or a current) may be supplied from the first electrode to the second electrode of the seventh transistor.

Figure 5:
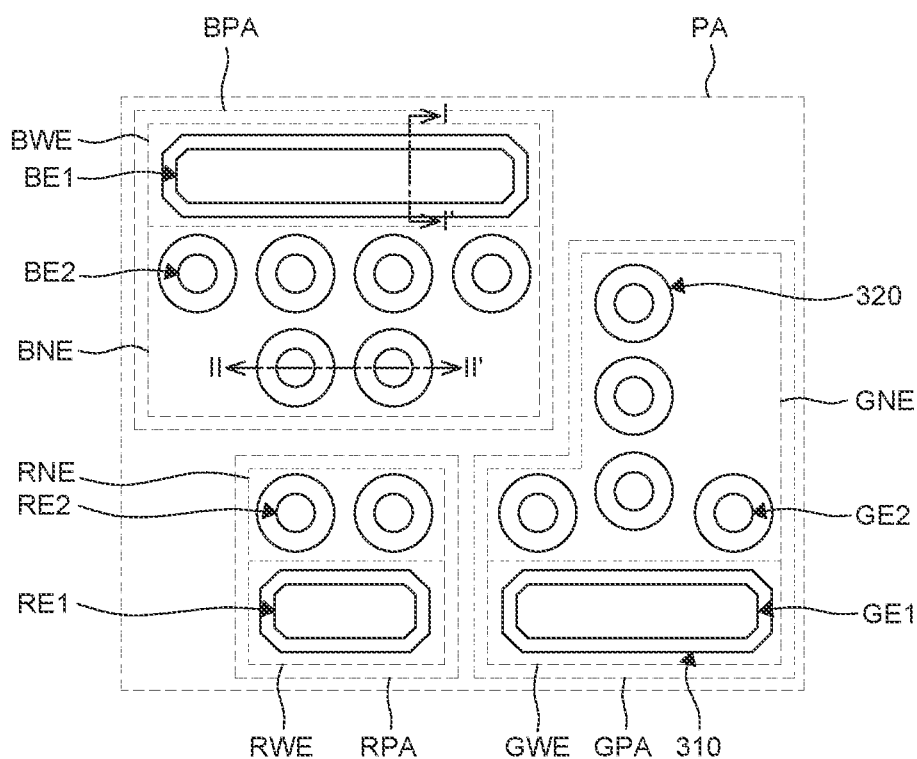
FIG. 5 is an example of lens placement in a display apparatus according to an exemplary embodiment of the present disclosure.

FIG. 5 is an example of lens placement included in a display apparatus according to an exemplary embodiment of the present disclosure.

Figure 6:
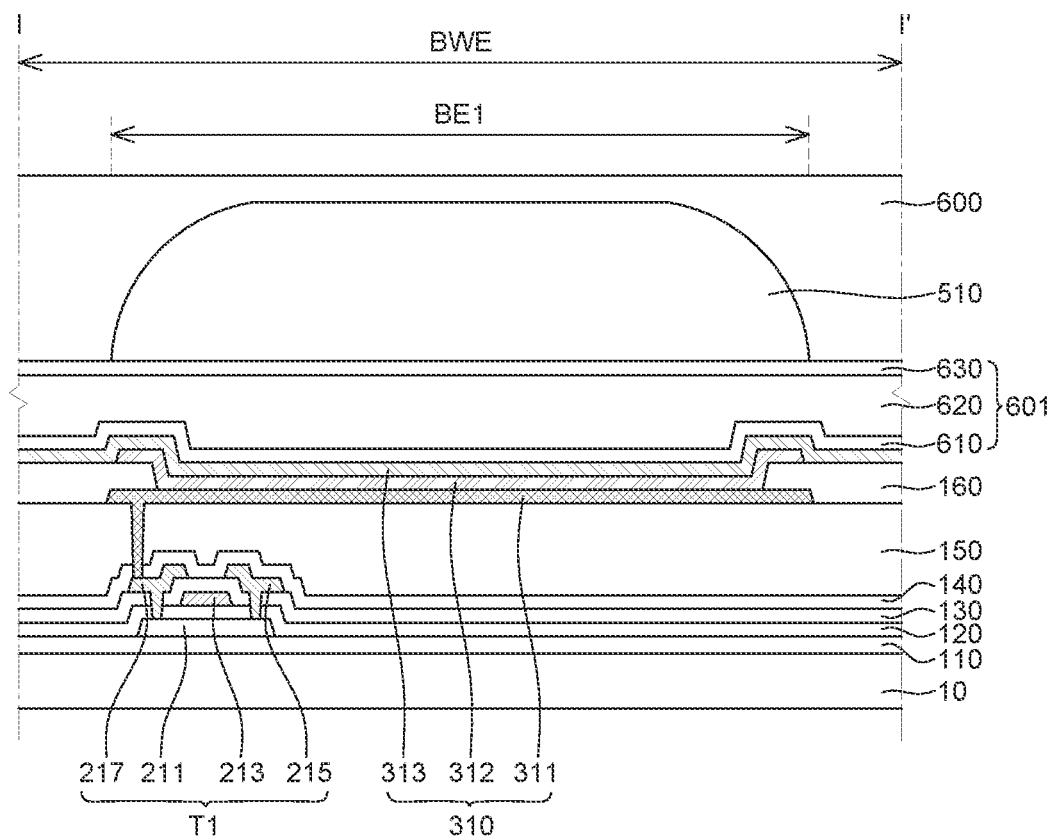
FIG. 6 illustrates an I-I' cross-section of FIG. 5 according to an exemplary embodiment of the present disclosure.

FIG. 6 illustrates an I-I' cross-section of FIG. 5 according to an exemplary embodiment of the present disclosure.

Figure 7:
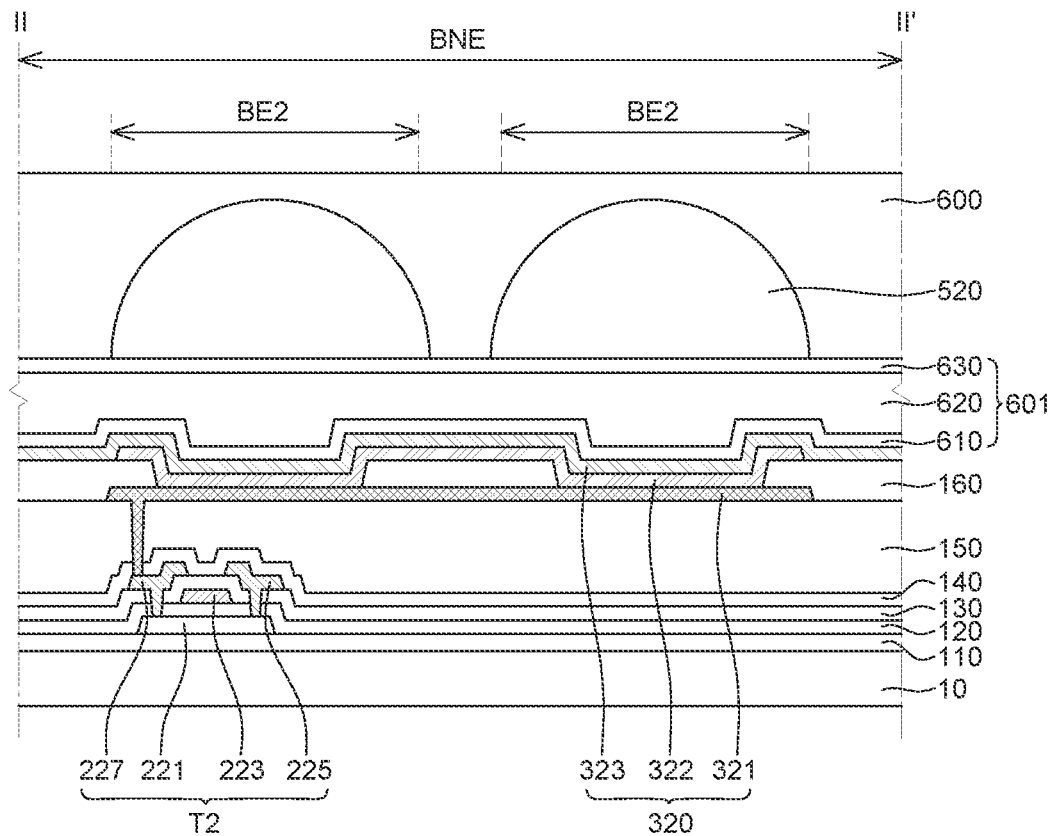
FIG. 7 illustrates an II-II' cross-section of FIG. 5 according to an exemplary embodiment of the present disclosure.

FIG. 7 illustrates an II-II' cross-section of FIG. 5 according to an exemplary embodiment of the present disclosure.

FIG. 5 illustrates an example that lenses are disposed on a flat surface of the pixel area PA when three sub pixels are disposed in the pixel area PA. FIG. 6 illustrates a cross-section taken along line I-I' of FIG. 5 according to an exemplary embodiment of the present disclosure and FIG. 7 illustrates a cross-section taken along the line II-II' of FIG. 5 according to an exemplary embodiment of the present disclosure. Hereinafter, FIGS. 5 to 7 will be described together.

Referring to FIGS. 5 to 7, the pixel area PA may include a blue sub pixel area BPA which outputs blue light, a red sub pixel area RPA which outputs red light, and a green sub pixel area GPA which outputs green light. According to the exemplary embodiment, the blue sub pixel area BPA corresponds to the first sub pixel, the red sub pixel area RPA corresponds to the second sub pixel, and the green sub pixel area GPA corresponds to a third sub pixel. The pixel circuit may correspond to each sub pixel. A corresponding pixel circuit may be disposed in every sub pixel.

The pixel area PA may include a first lens areas BWE, RWE, and GWE and second lens areas BNE, RNE, and GNE which provide different viewing angles. The second lens areas BNE, RNE, and GNE of each pixel area PA may respectively operate independently from the first lens areas BWE, RWE, and GWE of the pixel area PA. For example, each pixel area PA may include a first light emitting diode 310 (e.g., a light emitting element) located on the first lens areas BWE, RWE, and GWE of the corresponding pixel area PA and a second light emitting diode 320 (e.g., a light emitting element) located on the second lens areas BNE, RNE, and GNE of the corresponding pixel area PA. That is, the first lens overlaps the light emitting diode 310 and the second lens overlaps the light emitting diode 310.

The first light emitting diode 310 may emit light representing a specific color. For example, the first light emitting diode 310 may include a first lower electrode 311, a first emission layer 312, and a first upper electrode 313 which are laminated on the substrate 10 in this order. The substrate 10 may include an insulating material. The substrate 10 may include a transparent material. For example, the substrate 10 may include glass or plastic.

The first lower electrode 311 may include a conductive material. The first lower electrode 311 may include a material having a high reflectance. For example, the first lower electrode 311 may include metal, such as aluminum (Al), or silver (Ag). The first lower electrode 311 may have a multi-layered structure. For example, the first lower electrode 311 may have a structure in which a reflective electrode formed of a metal is located between transparent electrodes formed of a transparent conductive material, such as ITO and IZO.

The first emission layer 312 may generate light with luminance corresponding to a voltage difference between the first lower electrode 311 and the first upper electrode 313. For example, the first emission layer 312 may include an emission material layer (EML) including an emission material. The emission material may include an organic material, an inorganic material, or a hybrid material.

The first emission layer 312 may have a multi-layered structure. For example, the first emission layer 312 may further include at least one of a hole injection layer HIL, a hole transport layer HTL, an electron transport layer ETL, and an electron injection layer EIL.

The first upper electrode 313 may include a conductive material. The first upper electrode 313 may include a different material from that of the first lower electrode 311. A transmittance of the first upper electrode 313 may be higher than a transmittance of the first lower electrode 311. For example, the first upper electrode 313 may be a transparent electrode formed of a transparent conductive material, such as ITO and IZO. Accordingly, in the display apparatus according to the exemplary embodiment of the present disclosure, light generated by the first emission layer 312 may be emitted through the first upper electrode 313.

The second light emitting diode 320 may implement the same color as the first light emitting diode 310. The second light emitting diode 320 may have the same configuration as the first light emitting diode 310. For example, the second light emitting diode 320 may include a second lower electrode 321, a second emission layer 322, and a second upper electrode 323 which are laminated on the substrate 10 in this order.

The second lower electrode 321 corresponds to the first lower electrode 311, the second emission layer 322 corresponds to the first emission layer 312, and the second upper electrode 323 corresponds to the first upper electrode 313. For example, the second lower electrode 321 is formed for the second light emitting diode 320 with the same structure as the first lower electrode 311 and the second emission layer 322 and the second upper electrode 323 are the same. For example, the first light emitting diode 310 and the second light emitting diode 320 may be formed to have the same structure. However, it is not limited thereto and, in some cases, at least a partial configuration of the first light emitting diode 310 and the second light emitting diode 320 may be formed to be different.

In the exemplary embodiment, the second emission layer 322 may be spaced apart from the first emission layer 312. Therefore, in the display apparatus according to the exemplary embodiment of the present disclosure, light emission by a leakage current may be suppressed.

According to the exemplary embodiment of the present disclosure, in the display apparatus, light may be generated by only one of the first emission layer 312 and the second emission layer 322 by the selection of the user or according to a predetermined condition.

In the exemplary embodiment, at least one insulating film (for example, a device buffer film 110, a gate insulating film 120, an interlayer insulating film 130, a lower protection film 140, and an overcoat layer 150) is located on the substrate 10. The first light emitting diode 310 and the second light emitting diode 320 of each pixel area PA may be disposed one of the insulation films.

In the exemplary embodiment, the buffer film 110, the gate insulating film 120, the interlayer insulating film 130, the lower protection film 140, and the overcoat layer 150 may be laminated on the substrate 10. The buffer film 110 may include an insulating material. For example, the buffer film 110 may include an inorganic insulating material, such as silicon oxide $SiO_x$ or silicon nitride $SiN_x$. The buffer film 110 may have a multi-layered structure. For example, the buffer film 110 may have a laminated structure of a film formed of silicon nitride $SiN_x$ and a film formed of silicon oxide $SiO_x$.

In the exemplary embodiment, the gate insulating film 120 may include an insulating material. For example, the gate insulating film 120 may include an inorganic insulating material, such as silicon oxide $SiO_x$ or silicon nitride $SiN_x$. The gate insulating film 120 may include a material having a high permittivity. For example, the gate insulating film 120 may include a material having a high permittivity High-K, such as hafnium oxide HfO. The gate insulating film 120 may have a multi-layered structure.

The gate insulating film 120 may be located on the buffer film 110. The gate insulating film 120 may extend between a semiconductor layer and a gate electrode of the transistor. For example, gate electrodes of the driving transistor and the switching transistor may be insulated from semiconductor layers of the driving transistor and the switching transistor by the gate insulating film 120. The gate insulating film 120 may cover the first semiconductor layer and the second semiconductor layer of each pixel area PA. The gate electrodes of the driving transistor and the switching transistor may be located on the gate insulating film 120.

The interlayer insulating film 130 may include an insulating material. For example, the interlayer insulating film 130 may include an inorganic insulating material, such as silicon oxide SiO or silicon nitride SiN. The interlayer insulating film 130 may be located on the gate insulating film 120. The interlayer insulating film 130 extends between the gate electrode and the source electrode and between the gate electrode and the drain electrode of each of the driving transistor and the switching transistor. For example, the source electrode and the drain electrode of each of the driving transistor and the switching transistor may be insulated from the gate electrode by the interlayer insulating film 130. The interlayer insulating film 130 may cover the gate electrode of each of the driving transistor and the switching transistor. The source electrode and the drain electrode of each pixel area PA may be located on the interlayer insulating film 130. The gate insulating film 120 and the interlayer insulating film 130 may expose a source region and a drain region of each semiconductor pattern which is located in each pixel area PA.

In the exemplary embodiment, the lower protection film 140 may include an insulating material. For example, the lower protection film 140 may include an inorganic insulating material, such as silicon oxide SiO or silicon nitride SiN. The lower protection film 140 may be located on the interlayer insulating film 130. The lower protection film 140 may suppress the damage of a driving part, for example, the first transistor T1 and/or the second transistor T2 due to external moisture and shocks. The lower protection film 140 may extend along surfaces of the driving transistor and the switching transistor which are opposite to the substrate 10. The lower protection film 140 may be in contact with the interlayer insulating film 130 at the outside of the driving part located in each pixel area PA.

The overcoat layer 150 may include an insulating material. The overcoat layer 150 may include a material different from that of the lower protection film 140. For example, the overcoat layer 150 may include an organic insulating material. The overcoat layer 150 may be located on the lower protection film 140. The overcoat layer 150 removes a step caused by the driving part of each pixel area PA. For example, a top surface of the overcoat layer 150 which is opposite to the device substrate 10 may be a flat surface.

In the exemplary embodiment, the first transistor T1 may electrically be connected between the drain electrode of the driving transistor and the first lower electrode 311 of the first light emitting diode 310. The second transistor T2 may electrically be connected between the drain electrode of the driving transistor and the second lower electrode 321 of the second light emitting diode 320.

The first transistor T1 may include a first semiconductor layer 211, a first gate electrode 213, a first source electrode 215, and a first drain electrode 217. The first transistor T1 may have the same structure as the switching transistor and the driving transistor. For example, the first semiconductor layer 211 may be located between the buffer film 110 and the gate insulating film 120 and the first gate electrode 213 may be located between the gate insulating film 120 and the interlayer insulating film 130. The first source electrode 215 and the first drain electrode 217 may be located between the interlayer insulating film 130 and the lower protection film 140. The first gate electrode 213 may overlap a channel region of the first semiconductor layer 211. The first source electrode 215 may electrically be connected to the source region of the first semiconductor layer 211. The first drain electrode 217 may electrically be connected to the drain region of the first semiconductor layer 211.

In the exemplary embodiment, the second transistor T2 may include a second semiconductor layer 221, a second gate electrode 223, a second source electrode 225, and a second drain electrode 227. For example, the second semiconductor layer 221 is located on the same layer as the first semiconductor layer 211, the second gate electrode 223 is located on the same layer as the first gate electrode 213, the second source electrode 225 and the second drain electrode 227 may be located on the same layer as the first source electrode 215 and the first drain electrode 217.

In the exemplary embodiment, the first transistor T1 may be formed simultaneously with the switching transistor and the driving transistor. The first transistor T1 may be formed simultaneously with the second transistor T2.

The first light emitting diode 310 and the second light emitting diode 320 of each pixel area PA may be located on the overcoat layer 150 of the pixel area PA. For example, the first lower electrode 311 of the first light emitting diode 310 is electrically connected to the first drain electrode 217 (or the first source electrode 215) of the first transistor T1 through a contact hole which passes through the lower protection film 140 and the overcoat layer 150. The second lower electrode 321 of the second light emitting diode 320 is electrically connected to the second drain electrode 227 (or the second source electrode 225) of the second transistor T2 through a contact hole which passes through the lower protection film 140 and the overcoat layer 150.

The second lower electrode 321 of each pixel area PA may be spaced apart from the first lower electrode 311 of the pixel area PA. For example, a bank insulating film 160 may be located between the first lower electrode 311 and the second lower electrode 321 of each pixel area PA. The bank insulating film 160 may include an insulating material. For example, the bank insulating film 160 may include an organic insulating material. The bank insulating film 160 may include a material different from that of the overcoat layer 150.

The second lower electrode 321 of each pixel area PA is insulated from the first lower electrode 311 of the pixel area PA by the bank insulating film 160. For example, the bank insulating film 160 may cover an edge of the first lower electrode 311 and an edge of the second lower electrode 321 located in each pixel area PA. Accordingly, in the display apparatus, an image by the first lens areas BWE, RWE, and GWE of each pixel area PA in which the first light emitting diode 310 is located and an image by the second lens areas BNE, RNE, and GNE of each pixel area PA in which the second light emitting diode 320 is located may be supplied to the user.

The first emission layer 312 and the first upper electrode 313 of the first light emitting diode 310 located in each pixel area PA may be laminated on a partial area of the first lower electrode 311 exposed by the bank insulating film 160. The second emission layer 322 and the second upper electrode 323 of the second light emitting diode 320 located in each pixel area PA may be laminated on a partial area of the second lower electrode 321 exposed by the bank insulating film 160. For example, the bank insulating film 160 may divide the first emission areas BE1, RE1, and GE1 in which light by the first light emitting diode 310 is emitted and the second emission areas BE2, RE2, and GE2 in which light by the second light emitting diode 320 is emitted in each pixel area PA. For example, the second emission areas BE2, RE2, and GE2 divided in each pixel area PA are smaller than the first emission areas BE1, RE1, and GE1.

The second upper electrode 323 of each pixel area PA may electrically be connected to the first upper electrode 313 of the pixel area PA. For example, a voltage applied to the second upper electrode 323 of the second light emitting diode 320 located in each pixel area PA is equal to a voltage applied to the first upper electrode 313 of the first light emitting diode 310 located in the pixel area PA. The second upper electrode 323 of each pixel area PA may include the same material as the first upper electrode 313 of the pixel area PA. For example, the second upper electrode 323 of each pixel area PA may be formed simultaneously with the first upper electrode 313 of the pixel area PA. The second upper electrode 323 of each pixel area PA extends onto the bank insulating film 160 to be in direct contact with the first upper electrode 313 of the pixel area PA. Luminance of the first lens areas BWE, RWE, and GWE located in each pixel area PA and luminance of the second lens areas BNE, RNE, and GNE may be controlled by a driving current generated in the pixel area PA.

An encapsulation member 601 may be located on the first light emitting diode 310 and the second light emitting diode 320 of each pixel area PA. The encapsulation member 601 may suppress the damage of the light emitting diodes 310 and 320 due to moisture and shocks from the outside. The encapsulation member 601 may have a multi-layered structure. For example, the encapsulation member 601 includes a first encapsulation layer 610, a second encapsulation layer 620, and a third encapsulation layer 630 which are sequentially laminated, but the exemplary embodiments of the present disclosure are not limited thereto. The first encapsulation layer 610, the second encapsulation layer 620, and the third encapsulation layer 630 may include an insulating material. The second encapsulation layer 620 may include a material different from that of the first encapsulation layer 610 and the third encapsulation layer 630. For example, the first encapsulation layer 610 and the third encapsulation layer 630 are inorganic encapsulation layers including an inorganic insulating material and the second encapsulation layer 620 includes an organic encapsulation layer including an organic insulating material. Therefore, the light emitting diodes 310 and 320 of the display apparatus may efficiently suppress the damage due to the moisture and shocks from the outside.

The first lens 510 and the second lens 520 may be located on the encapsulation member 601 of each pixel area PA.

The first lens 510 may be located on the first lens areas BWE, RWE, and GWE of each pixel area PA. For example, light generated by the first light emitting diode 310 in each pixel area PA may be emitted through the first lens 510 of the pixel area PA. The first lens 510 may have a shape that does not limit light of at least one direction. For example, a flat shape of the first lens 510 in each pixel area PA may have a bar shape which extends in a first direction.

In this case, a traveling direction of light emitted from the first lens areas BWE, RWE, and GWE of each pixel area PA may not be limited in the first direction. For example, contents (or images) provided through the first lens areas BWE, RWE, and GWE of each pixel area PA may be shared by surrounding people which is adjacent to the user in the first direction. When the contents are provided through the first lens areas BWE, RWE, and GWE, the contents are provided at a first viewing angle range which is wider than a second viewing angle range supplied by the second lens areas BNE, RNE, and GNE and this is referred to as a first mode.

The second lens 520 may be located on the second lens areas BNE, RNE, and GNE of each pixel area PA. Light generated by the second light emitting diode 320 in each pixel area PA may be emitted through the second lens 520 of the pixel area PA. A traveling direction of light which passes through the second lens 520 may be limited to the first direction and/or the second direction. For example, a shape of the second lens 520 located in the pixel area PA may have a circular shape. In this case, a traveling direction of light emitted from the second lens areas BNE, RNE, and GNE of each pixel area PA may be limited to the first direction and the second direction. For example, the contents supplied by the second lens areas BNE, RNE, and GNE of the pixel area PA are not shared by the people around the user. When the contents are provided through the second lens areas BNE, RNE, and GNE, the contents are provided at the second viewing angle range which is narrower than the first viewing angle range supplied by the first lens areas BWE, RWE, and GWE and this is referred to as a second mode.

The first emission areas BE1, RE1, and GE1 included in the first lens areas BWE, RWE, and GWE of each pixel area PA may have a shape corresponding to the first lens 510 located on the first lens area BWE, RWE, and GWE of each pixel area PA. For example, a flat shape of the first emission areas BE1, RE1, and GE1 defined in the first lens areas BWE, RWE, and GWE of each pixel area PA may have a bar shape extending in the first direction. The first lens 510 located on the first lens areas BWE, RWE, and GWE of each pixel area PA may have a larger size than the first emission areas BE1, RE1, and GE1 included in the first lens areas BWE, RWE, and GWE of each pixel area PA. Accordingly, the efficiency of light emitted from the first emission areas BE1, RE1, and GE1 of the pixel area PA may be improved.

The second emission areas BE2, RE2, and GE2 included in the second lens areas BNE, RNE, and GNE of each pixel area PA may have a shape corresponding to the second lens 520 located on the second lens areas BNE, RNE, and GNE of each pixel area PA. For example, a shape of the second emission areas BE2, RE2, and GE2 included in the second lens areas BNE, RNE, and GNE of each pixel area PA may have a circular shape. The second lens 520 located on the second lens areas BNE, RNE, and GNE of each pixel area PA may have a larger size than the second emission areas BE2, RE2, and GE2 included in the second lens areas BNE, RNE, and GNE of each pixel area PA. For example, a flat shape of the second emission areas BE2, RE2, and GE2 located in the second lens areas BNE, RNE, and GNE of each pixel area PA may be a concentric to a flat shape of the second lens 520 located on the second lens areas BNE, RNE, and GNE of each pixel area PA. In this case, the efficiency of light emitted from the second emission areas BE2, RE2, and GE2 of the pixel area PA may be improved.

In the exemplary embodiment, the first lens areas BWE, RWE, and GWE of the pixel area PA may include one first emission areas BE1, RE1, and GE1. The second lens areas BNE, RNE, and GNE of the pixel area PA may include a plurality of second emission areas BE2, RE2, and GE2.

In the exemplary embodiment, one first lens 510 may be disposed on the first lens areas BWE, RWE, and GWE of the pixel area PA. A plurality of second lenses 520 is located on the second lens areas BNE, RNE, and GNE of the pixel area PA.

In one exemplary embodiment, the second emission areas BE2, RE2, and GE2 included in the second lens areas BNE, RNE, and GNE of the pixel area PA may be driven for every sub pixel area. The second emission areas (for example, second emission areas BE2, RE2, or GE2) included in one sub pixel area may be simultaneously driven.

In the exemplary embodiment, one second lower electrode 321 may be located on the second lens areas BNE, RNE, and GNE of each pixel area PA. The bank insulating film 160 may be located between the second lower electrode 321 and the second emission layer 322 between the second emission areas BE2, RE2, and GE2. The bank insulating film 160 is located between the second lower electrode 321 and the second emission layer 322 between the second emission areas BE2, between the second emission areas RE2, and/or between the second emission areas GE2. The second emission layer 322 is spaced apart from the second lower electrode 321 by the bank insulating film 160 between the second emission areas BE2, RE2, GE2 of each second lens area BNE, RNE, GNE. In this case, the luminous efficiency of the second emission areas BE2, RE2, and GE2 may be improved.

In one exemplary embodiment, a size of each of the second emission areas BE2, RE2, and GE2 located in the second lens areas BNE, RNE, and GNE of the pixel area PA may be specified by a specific value. For example, the size of each of the second emission areas BE2, RE2, and GE2 located in the second lens areas BNE, RNE, and GNE may be implemented to be the same. Each of the second emission areas BE2, RE2, and GE2 located in the second lens areas BNE, RNE, and GNE of the pixel area PA may have the same size as second emission areas BE2, RE2, and GE2 included in second lens areas BNE, RNE, and GNE of an adjacent pixel area PA.

In the exemplary embodiment, the number of second emission areas may vary in each sub pixel area RPA, GPA, BPA. For example, the number of second emission areas BE2 defined in the second lens area BNE of the blue sub pixel area BPA may be larger than the number of second emission areas RE2 defined in the second lens area RNE of the red sub pixel area RPA. The number of second emission areas RE2 defined in the second lens area RNE of the red sub pixel area RPA may be larger than the number of second emission areas GE2 defined in the second lens area GNE of the green sub pixel area GPA. In this case, an efficiency deviation of the second light emitting diode 320 located on the second lens areas BNE, RNE, and GNE of the pixel area PA may be compensated by the number of second emission areas BE2, RE2, and GE2 defined in the second lens areas BNE, RNE, and GNE of each pixel area PA.

In the exemplary embodiment, the sizes of first emission areas BE1, RE1, GE1 may vary in each sub pixel area RPA, GPA, BPA. For example, the first emission area BE1 of the blue sub pixel area BPA has a different size from the first emission area RE1 of the red sub pixel area RPA and has a different size from the first emission area GE1 of the green sub pixel area GPA. The first emission area BE1 of the blue sub pixel area BPA may be larger than the first emission area RE1 of the red sub pixel area RPA. The first emission area RE1 of the red sub pixel area RPA may be larger than the first emission area GE1 of the green sub pixel area GPA. Therefore, in the display apparatus according to the exemplary embodiment of the present disclosure, an efficiency deviation of the first light emitting diode 310 located on the first lens areas BWE, RWE, and GWE of each pixel area PA may be compensated by the size of the first emission areas BE1, RE1, and GE1 defined in the first lens areas BWE, RWE, and GWE of each pixel area PA.

In the exemplary embodiment, the lens protection film 600 may be located on the first lens 510 and the second lens 520 of the pixel area PA. The lens protection film 600 may include an insulating material. For example, the lens protection film 600 may include an organic insulating material. A refractive index of the lens protection film 600 is smaller than refractive indexes of the first lens 510 and the second lens 520 located in each pixel area PA. Accordingly, in the display apparatus according to the exemplary embodiment of the present disclosure, light which passes through the first lens 510 and the second lens 520 in each pixel area may not be reflected toward the substrate 10 by the refractive index difference from the lens protection film 600.

According to the exemplary embodiment, the first lens 510 may be disposed on the pixel area PA disposed in the first area of the display apparatus to be described below. The first lens 510 and the second lens 520 may be disposed on the pixel area PA disposed in the second area of the display apparatus. In this case, the first area may be fixed so that the viewing angle corresponds to the first lens 510 (e.g., a first viewing angle). The viewing angle of the second area may be changed in accordance with the driving of the light emitting diode related to the first lens 510 or the second lens 520. That is, the viewing angle of the second area is variable and is configured to switch between the viewing angle of the first lens 510 (e.g., the first viewing angle) and the viewing angle of the second lens 520 (e.g., a second viewing angle).

Figure 8:
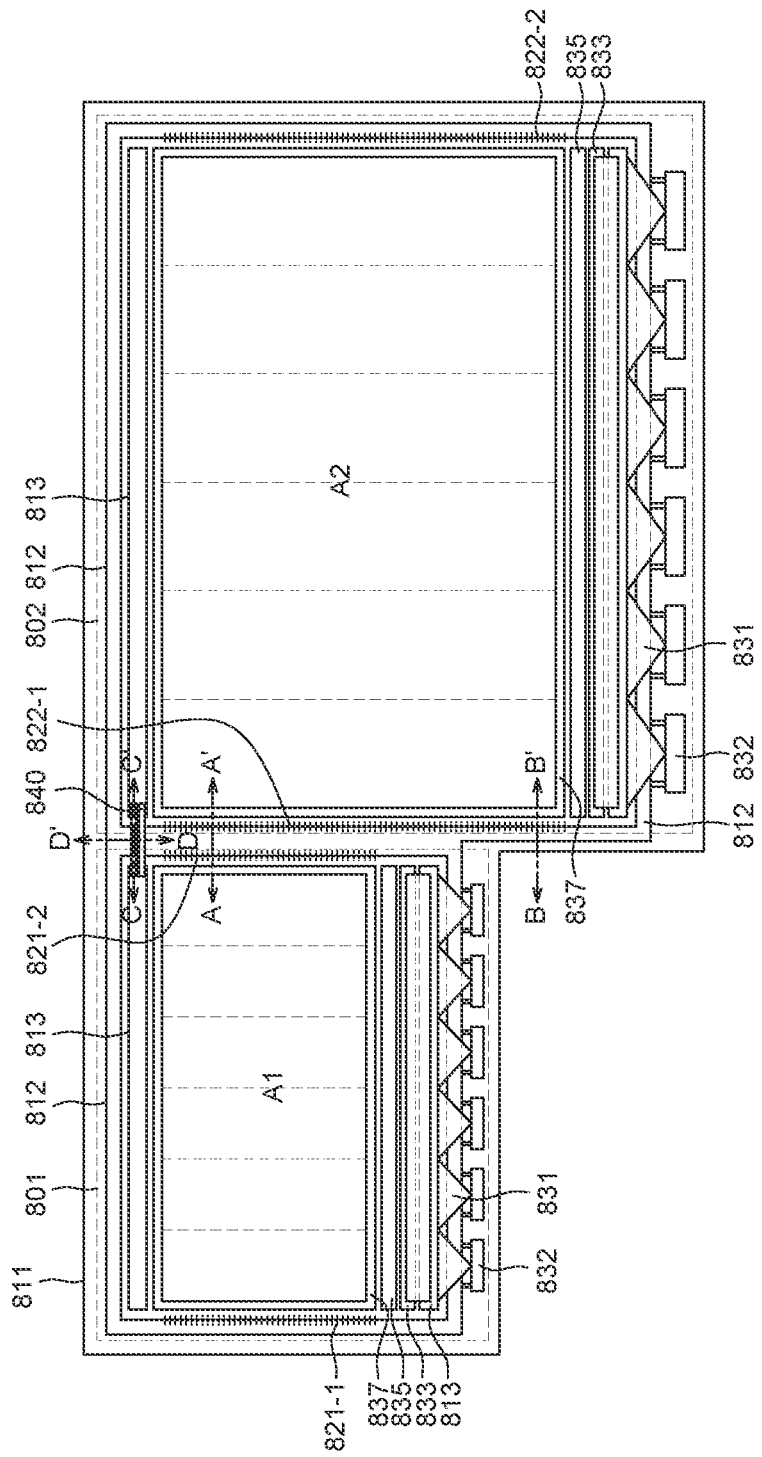
FIG. 8 illustrates a conceptual view of a display apparatus according to an exemplary embodiment of the present disclosure.

FIG. 8 illustrates a conceptual view of a display apparatus according to an exemplary embodiment of the present disclosure.

Referring to FIG. 8, the display apparatus may include a first area 801, a second area 802, and a low potential line 812 (e.g., a low potential voltage line). In the exemplary embodiment, the display apparatus may include a cover glass (CG) 811 disposed on the first area 801, the low potential line 812, and the second area 802. The cover glass 811 may integrally or commonly be disposed on the first area 801, the low potential line 812, and the second area 802. For example, one cover glass 811 may be disposed on the first area 801, the low potential line 812, and the second area 802.

According to the exemplary embodiment, the cover glass 811 may be implemented to be larger than the first area 801 and the second area 802 so as to commonly cover the first area 801 and the second area 802. Even though in FIG. 8, it is illustrated that the cover glass 811 is implemented to have a shape corresponding to an outer peripheral shape of the first area 801 and the second area 802, it is not limited thereto. Therefore, the cover glass may be implemented in various shapes such as an irregular shape, rectangular, circular, or oval shapes.

In the exemplary embodiment, the first area 801 may include a first display area A1 with a first size. The first area 801 may include a high potential line 813, a data line 831, a pad 832, a reference voltage line 833, a compensation circuit 835, a dummy pixel 837, and first gate driving circuits 821-1 and 821-2. The first area 801 may include at least a part of the low potential line 812.

In the exemplary embodiment, the high potential line 813 may be disposed above and below the first display area A1. For example, the high potential line 813 may be disposed to extend horizontally or toward the second display area A2 from the first display area A1, above and below the first display area A1.

In the exemplary embodiment, the reference voltage line 833 and the compensation circuit 835 may be disposed between the high potential line 813 below the first display area A1 and the first display area A1. The compensation circuit 835 may be disposed to be more adjacent to the first display area A1 than the reference voltage line 833, but the present exemplary embodiment is not limited to this positional relationship.

In the exemplary embodiment, the low potential line 812 may be disposed along the outer periphery of the first display area A1. For example, the low potential line 812 may be disposed so as to at least partially surround/enclose the first display area A1 at the outermost side of the first display area A1 in a plan view of the display device. In this case, the high potential line 813, the reference voltage line 833, and the compensation circuit 835 may be disposed between the first display area A1 and the low potential line 812 in a plan view of the display device.

In the exemplary embodiment, a pad 832 may be disposed below the low potential line 812 in the plan view. The pad 832 is implemented as a film but is not limited thereto. As illustrated in the drawing, the pad 832 is divided into a plurality of configurations to be disposed below the low potential line 812 in the horizontal direction or the row direction. In the pad 832, the data driving circuit (for example, the data driving circuit DD of FIG. 1) may be disposed. The data line 831 and the high potential line 813 may extend from the pad 832. The data line 831 and the high potential line 813 extend from the pad unit 832 to be disposed in the first display area A1.

In the exemplary embodiment, the data driving circuit may supply a data voltage to the pixel circuit disposed in the first display area A1 through the data line 831. The data line 831 may be disposed so as to extend from the pad 832 toward the first display area A1. The data line 831 may overlap at least one of the low potential line 812, the high potential line 813, the reference voltage line 833, and the compensation circuit 835 disposed below the first display area A1. For example, the data line 831 may overlap at least a part of the low potential line 812, at least a part of the high potential line 813, and at least a part of the reference voltage line 833.

In the exemplary embodiment, the compensation circuit 835 may include an AP switch and/or MUX. Various signals may be supplied to the pixel circuit disposed in the first display area A1 through the compensation circuit 835.

In the exemplary embodiment, the pad 832 is bent to be disposed on a rear surface of the first display area A1. For example, a part of an upper area of the pad 832 may be bent toward the rear surface of the first display area A1. In this case, a part of the pad 832 may be disposed on a rear surface of the first display area A1.

In the exemplary embodiment, the dummy pixel 837 and the first gate driving circuits 821-1 and 821-2 may be disposed between the first display area A1 and the low potential line 812. The dummy pixel 837 may be disposed to be adjacent to the first display area A1 along the circumference of the first display area A1. The first gate driving circuits 821-1 and 821-2 may be divided into a 1-1-th gate driving circuit 821-1 and a 1-2-th gate driving circuit 821-2. The 1-1-th gate driving circuit 821-1 and the 1-2-th gate driving circuit 821-2 may be disposed on both sides of the first display area A1. The 1-1-th gate driving circuit 821-1 and the 1-2-th gate driving circuit 821-2 may be disposed on left and right sides of the first display area A1 along a vertical length of the first display area A1.

In the exemplary embodiment, the dummy pixel 837 is disposed around the first display area A1 to be connected to the first display area A1. The dummy pixel 837 may serve to compensate for a load effect of the first display area A1 so as to perform uniform light emission in the first display area A1.

In the exemplary embodiment, the second area 802 may include a second display area A2 with a second size. The second size may be larger than the first size. The second area 802 may be larger than the first area 801. The second area 802 may include a high potential line 813, a data line 831, a pad 832, a reference voltage line 833, a compensation circuit 835, a dummy pixel 837, and second gate driving circuits 822-1 and 822-2. The second area 802 may include at least a part of the low potential line 812.

In the exemplary embodiment, the high potential line 813 may be disposed above and below the second display area A2. For example, the high potential line 813 may be disposed to extend horizontally or toward the second display area A2 from the second display area A2, above and below the second display area A2.

In the exemplary embodiment, the reference voltage line 833 and the compensation circuit 835 may be disposed between the high potential line 813 below the second display area A2 and the second display area A2. The compensation circuit 835 may be disposed to be more adjacent to the second display area A2 than the reference voltage line 833, but the present exemplary embodiment is not limited to this positional relationship.

In the exemplary embodiment, the low potential line 812 may be disposed along the outer periphery of the second display area A2 in the plan view. For example, the low potential line 812 may be disposed so as to at least partially surround/enclose the second display area A2 at the outermost side of the second display area A2 in the plan view. In this case, the high potential line 813, the reference voltage line 833, and the compensation circuit 835 may be disposed between the second display area A2 and the low potential line 812.

In the exemplary embodiment, a pad 832 may be disposed below the low potential line 812 below the second display area A2. The pad 832 is implemented as a film but is not limited thereto. As illustrated in the drawing, the pad 832 is divided into a plurality of configurations to be disposed below the low potential line 812 in the horizontal direction or the row direction. In the pad 832, the data driving circuit (for example, the data driving circuit DD of FIG. 1) may be disposed. The data line 831 and the high potential line 813 extend from the pad 832. The data line 831 and the high potential line 813 extend from the pad unit 832 to be disposed in the second display area A2.

In the exemplary embodiment, the data driving circuit may supply a data voltage to the pixel circuit disposed in the second display area A2 through the data line 831. The data line 831 may be disposed so as to extend from the pad 832 toward the second display area A2. The data line 831 may overlap at least one of the low potential line 812, the high potential line 813, the reference voltage line 833, and the compensation circuit 835 disposed below the second display area A2. For example, the data line 831 may overlap at least a part of the low potential line 812, at least a part of the high potential line 813, and at least a part of the reference voltage line 833.

In the exemplary embodiment, the compensation circuit 835 may include an AP switch and/or MUX. Various signals are supplied to the pixel circuit disposed in the second display area A2 through the compensation circuit 835.

In the exemplary embodiment, the pad 832 is bent to be disposed on a rear surface of the second display area A2. For example, a part of an upper area of the pad 832 may be bent toward the rear surface of the second display area A2. In this case, a part of the pad 832 may be disposed on a rear surface of the second display area A2.

In the exemplary embodiment, the dummy pixel 837 and the second gate driving circuits 822-1 and 822-2 may be disposed between the second display area A2 and the low potential line 812. The dummy pixel 837 may be disposed to be adjacent to the second display area A2 along the circumference of the second display area A2. The second gate driving circuits 822-1 and 822-2 may be divided into a 2-1-th gate driving circuit 822-1 and a 2-2-th gate driving circuit 822-2. The 2-1-th gate driving circuit 822-1 and the 2-2-th gate driving circuit 822-2 may be disposed on both sides of the second display area A2. The 2-1-th gate driving circuit 822-1 and the 2-2-th gate driving circuit 822-2 may be disposed on both sides of the second display area A2 along a vertical length of the second display area A2.

In the exemplary embodiment, the dummy pixel 837 is disposed around the second display area A2 to be connected to the second display area A2. The dummy pixel 837 may serve to compensate for a load effect of the second display area A2 so as to perform uniform light emission in the second display area A2.

In the exemplary embodiment, the first gate driving circuits 821-1 and 821-2 and the second gate driving circuits 822-1 and 822-2 may have different sizes. As illustrated in the drawing, lengths of the first gate driving circuits 821-1 and 821-2 may be shorter than lengths of the second gate driving circuits 822-1 and 822-2.

For example, the 1-2-th gate driving circuit 821-2 may be disposed to have a size corresponding to the vertical length (or a height) of the first display area A1. The 1-2-th gate driving circuit 821-2 may be disposed to have a size corresponding to the vertical length (or a height) of the second display area A2. The vertical length of the first display area A1 and the vertical length of the second display area A2 are different so that sizes (or lengths) of the 1-2-th gate driving circuit 821-2 and the 2-1-th gate driving circuit 822-1 may also be different.

In the exemplary embodiment, as illustrated in FIG. 8, the 1-2-th gate driving circuit 821-2 may be disposed with at least a part of the gate driving circuit 822-1 and at least a part of the low potential line 812 therebetween. A more specific example with regard to this will be described with reference to FIG. 9. Another part of the 2-1-th gate driving circuit 822-1 may be disposed with a part of the compensation circuit 835, the high potential line 813, and the reference voltage line 833 and the low potential line 812 below the first display area A1 therebetween. The remaining part of the 2-1-th gate driving circuit 822-1 may be independently disposed at one side of the low potential line 812. That is, the remaining part of the gate driving circuit 822-1 may be independently disposed without being opposite to (or facing) the configuration of the first display apparatus A1. A more specific example with regard to the placement of the remaining part of the gate driving circuit 822-1 will be described with reference to FIG. 10.

In the exemplary embodiment, the first gate driving circuits 821-1 and 821-2 and the second gate driving circuits 822-1 and 822-2 may be connected to the pad 832. For example, a driving signal is input to drive the first gate driving circuits 821-1 and 821-2 and the second gate driving circuits 822-1 and 822-2. The driving signal is supplied to the first gate driving circuits 821-1 and 821-2 and the second gate driving circuits 822-1 and 822-2 from the pad 832. Even though it is not illustrated, a wiring line for supplying a gate driving signal may be disposed between the first gate driving circuits 821-1 and 821-2 and the second gate driving circuits 822-1 and 822-2 and the pad 832.

In the exemplary embodiment, the low potential line 812 may be disposed at the outer periphery of the first area 801 and the second area 802 and between the first area 801 and the second area 802. The low potential line 812 may supply a low potential power voltage to the pixel circuit (for example, the pixel circuit 400 of FIG. 4) included in each of the first area 801 and the second area 802. The low potential power voltage may include a low potential power voltage ELVSS of FIG. 4. A more specific example for the low potential voltage 812 disposed between first area 801 and the second area 802 and placement with regard thereto will be described with reference to FIG. 9.

In the exemplary embodiment, at least a part of the low potential line disposed between the first area 801 and the second area 802 may extend to the first display area A1. For example, a part of the low potential line disposed between the first area 801 and the second area 802 may extend between the high potential line 813 and the pad 832 disposed in the first area 801. At least another part of the low potential line 812 disposed between the first area 801 and the second area 802 may extend along one end of the second area 802.

In the exemplary embodiment, a part of the low potential line 812 extending in the first display area A1 and another part extending along one end of the second area 802 may extend to be perpendicular to each other. The low potential line 812 extends along one end of the second area 802 and then may further extend between the high potential line 813 and the pad 832 disposed in the second area 802.

In the exemplary embodiment, the high potential line 813 may include a first high potential line disposed above the first display area A1 and a second high potential line disposed above the second display area A2. The high potential line 813 disposed above the first display area A1 is referred to as a first high potential line and the high potential line 813 disposed above the second display area A2 may be referred to as a second high potential line. The first high potential line and the second high potential line may be connected. For example, the display apparatus may further include a bridge 840 which connects the first high potential line and the second high potential line. The first high potential line and the second high potential line may be connected through the bridge 840.

In the exemplary embodiment, the first area 801 may further include a first contact hole through which the bridge 840 and the first high potential line are connected. The second area 802 may further include a second contact hole through which the bridge 840 and the second high potential line are connected. The bridge 840 may be referred to as various terms, such as a connection member, a connection metal, or a metal unit depending on the exemplary embodiment, but is not limited to this term. A more specific example with regard to the bridge 840 will be described with reference to FIGS. 11 and/or 12.

In the exemplary embodiment, a 1-1-th lens may be disposed on each of the plurality of organic light emitting diodes disposed in the first area 801 (or the first display area A1). A 1-2-th lens is disposed on a first organic light emitting diode from of the plurality of organic light emitting diodes disposed in the second area 802 (or the second display area A2) and a second lens which has a shape different from that of the 1-1-th lens and/or the 1-2-th lens may be disposed on a second organic light emitting diode from the plurality of light emitting diodes in the second display area A2.

In the exemplary embodiment, the 1-1-th lens and the 1-2-th lens may correspond to the shape of the first lens 510 of FIG. 6. For example, the 1-1-th lens and the 1-2-th lens may have a rectangular shape. The 1-1-th lens may have a size which is equal to or larger than that of the 1-2-th lens. The first area 801 in which the 1-1-th lens is disposed may be an area adjacent to the driver seat of the vehicle. In this case, contents displayed on the display apparatus is reflected and displayed on a front glass of the vehicle based on the shape and the size of the 1-1-th lens so that a situation which may interfere with the driving of the vehicle may be reduced.

In one exemplary embodiment, the second lens may correspond to a shape of the second lens 520 of FIG. 7. For example, the second lens may have a circular shape. In this case, a viewing angle of the contents to be displayed in the second area 802 is controlled according to the driving situation of the vehicle to more safely drive the vehicle. For example, when entertainment contents, such as games are displayed in the second area 802 during the driving, the contents are displayed through a light emitting diode corresponding to the second lens 520 but not a light emitting diode corresponding to the 1-2-th lens in the second area 802 to control the viewing angle of the second area 802 part. Therefore, the driver of the vehicle may not watch the content.

If the contents which are displayed through the second area 802 are commonly watchable by the driver and the passenger of the vehicle, the contents are displayed through a light emitting diode corresponding to the 1-2-th lens disposed in the second area 802 but not a light emitting diode corresponding to the second lens disposed in the second area 802. In this case, the driver and the passenger of the vehicle may watch the contents together.

Figure 9:
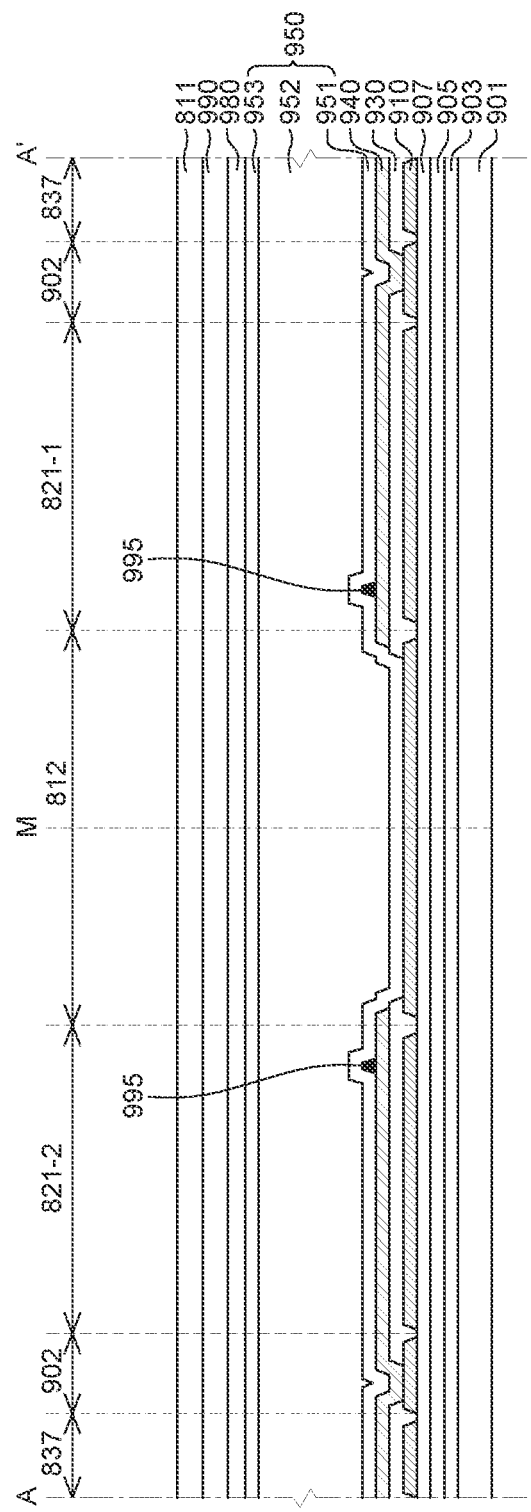
FIG. 9 illustrates an A-A' cross-section of FIG. 8 according to an exemplary embodiment of the present disclosure.

FIG. 9 illustrates an A-A' cross-section of FIG. 8 according to an exemplary embodiment.

FIG. 9 illustrates an example of a laminated structure between the first display area A1 and the second display area A2 of FIG. 8. A middle line M may be a line which crosses the center of the A-A' cross-section. The A-A' cross-section may be symmetrical with respect to the middle line M.

Referring to FIG. 9, a multi-buffer layer 903, an active buffer layer 905, and an insulating layer 907 may be sequentially disposed on a substrate 901. The multi-buffer layer 903 may include a plurality of buffer layers. The multi-buffer layer 903 and/or the active buffer layer 905 may include an inorganic insulating material, such as silicon oxide $SiO_x$ or silicon nitride $SiN_x$. In an exemplary embodiment, the active buffer layer 905 may include a gate insulating film. The active buffer layer 905 may include a gate insulating film. The gate insulating film may include an inorganic insulating material, such as silicon oxide $SiO_x$ and silicon nitride $SiN_x$.

In the exemplary embodiment, the insulating layer 907 may be configured by a plurality of layers. If the insulating layer 907 is configured by two layers, the insulating layer may be referred to as a first insulating layer and the second insulating layer but are not limited to the terms.

According to the exemplary embodiment, at least one of the multi-buffer layer 903 and the active buffer layer 905 may be referred to as an insulating layer, but the exemplary embodiment is not limited to this term.

An electrode layer 910 may be disposed on the insulating layer 907. The electrode layer 901 may configure at least a part of the dummy pixel 837, at least a part of a 1-2-th gate driving circuit 821-2, at least a part of the 2-1-th gate driving circuit 822-1, at least a part of the low potential line, and at least a part of a trench 902. The trench 902 is a configuration disposed between the 1-2-th gate driving circuit 821-2 (or a 2-1-th gate driving circuit 822-1) and the dummy pixel 837 and may serve to reduce gas emitted to the display areas A1 and A2.

At least one of the planarization layer 930, the bank layer 940, and the encapsulation member 950 may be disposed on the electrode layer 910. For example, a planarization layer 930 may be disposed on the electrode layer 910 which configures the dummy pixel 837, the 1-2-th gate driving circuit 821-2, and the 2-1-th gate driving circuit 822-1. The electrode layer 910 which configures the dummy pixel 837, the 1-2-th gate driving circuit 821-2, and the 2-1-th gate driving circuit 822-1 may be covered by the planarization layer 930. The planarization layer 930 and the bank layer 940 may be disposed in at least a part on both ends of the trench 902. A part of a top surface of the trench 902 is exposed to be in contact with an encapsulation member 950.

In the exemplary embodiment, both ends of the electrode layer 910 corresponding to the low potential line 812 may be covered by the planarization layer 930. For example, a side surface of the electrode layer 910 corresponding to the low potential line 812 and at least a part of the top surface connected to the side surface may be covered by the planarization layer 930. Another part of the top surface of the electrode layer 910 corresponding to the low potential line 812 may be covered by a first encapsulation layer 951.

In the exemplary embodiment, a first dam 995 may be disposed on each of the 1-2-th gate driving circuit 821-2 and the 2-1-th gate driving circuit 822-1. The first dam 995 may be disposed on each of the 1-2-th gate driving circuit 821-2 and the 2-1-th gate driving circuit 822-1 to be adjacent to the low potential line 812.

The first dam 995 may be formed of the same material as a spacer disposed in the first display area A1 and/or the second display area A2. Here, the spacer includes a configuration which is located in the vicinity of the pixel as a barrier wall to suppress an organic emission material from invading other pixel area while depositing an organic emission layer of the pixel. The spacer may be formed of an organic material or a mixture of organic and inorganic materials but is not limited to this example.

In the exemplary embodiment, an encapsulation member 950 (for example, an encapsulation member 601 of FIG. 6) may be disposed on the bank layer 940. In the encapsulation member 950, a first encapsulation layer 951, a second encapsulation layer 952, and a third encapsulation layer 953 may be disposed. The first encapsulation layer 951, the second encapsulation layer 952, and the third encapsulation layer 953 may include an insulating material. For example, the first encapsulation layer 951 and the third encapsulation layer 953 are inorganic encapsulation layers including an inorganic insulating material and the second encapsulation layer 952 may include an organic encapsulation layer including an organic insulating material.

An adhesive layer 980 may be disposed on the encapsulation member 950. A polarization layer 990 may be disposed on the adhesive layer 980. A cover glass 811 may be disposed on the polarization layer 990. The cover glass 811 may integrally cover the first display area A1, the second display area A2, and an area between the first display area A1 and the second display area A2.

The low potential line 812 illustrated in FIG. 9 may be connected to the first display area A1 and the second display area A2. The low potential line 812 may supply a low potential power voltage VSS to the first display area A1 and the second display area A2 that is less than the high potential power voltage ELVDD.

Figure 10:
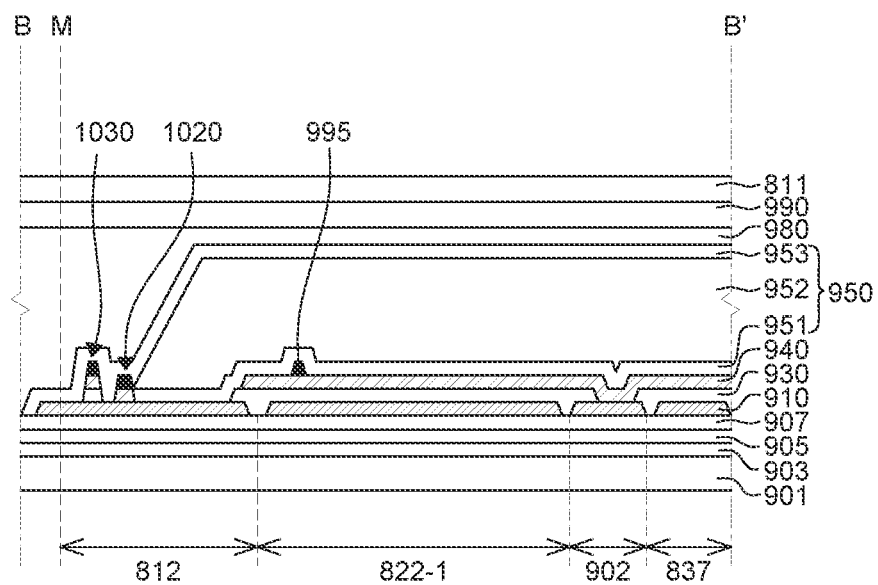
FIG. 10 illustrates a B-B' cross-section of FIG. 8 according to an exemplary embodiment of the present disclosure.

FIG. 10 illustrates a B-B' cross-section of FIG. 8 according to one embodiment.

FIG. 10 illustrates an example of a laminated structure of one end of the second area 802 of FIG. 8. A middle line M of FIG. 10 may be a line extending from the middle line M of FIG. 9. The low potential line 812 of FIG. 10 may be a part extending along one end of the second area 802. Hereinafter, a repeated content of the above-described content will be omitted.

Referring to FIG. 10, a B-B' cross-section may include at least a part of the second area 802 of FIG. 8. The B-B' cross-section may be a part in which the first area 801 of FIG. 8 is not disposed. Hereinafter, for the convenience of description, a part corresponding to the A-A' cross-section is referred to as a first part and a part corresponding to the B-B' cross-section is referred to as a second part.

In the exemplary embodiment, the first encapsulation layer 951, the second encapsulation layer 952, and the third encapsulation layer 953 may be disposed in a part of the low potential line 812 which is disposed in the second part. The first encapsulation layer 951 and/or the third encapsulation layer 953 may be disposed in the other part of the low potential line 812 which is disposed in the second part. According to the exemplary embodiment, at least one dam 1020, 1030 may be disposed on the other part of the low potential line 812 disposed in the second part. The first encapsulation layer 951 and/or the third encapsulation layer 953 may be disposed on at least one dam 1020, 1030.

The at least one dam 1020, 1030 may include a second dam 1020 and a third dam 1030. The second dam 1020 may have a structure in which a material corresponding to the bank layer 940 and a material corresponding to the spacer are laminated. The third dam 1030 may have a structure in which a material corresponding to the planarization layer 930, a material corresponding to the bank layer 940, and a material corresponding to the spacer are laminated. The third dam 1030 may be disposed at an outside more than the second dam 1020. A height of the third dam 1030 may be higher than a height of the second dam 1020.

In the exemplary embodiment, on the insulating layer 907 of the second part, the low potential line 812 is disposed to the middle line M and an encapsulation layer (for example, the first encapsulation layer 951 and/or the third encapsulation layer 953) and/or the adhesive layer 980 may be disposed at the outer periphery over the middle line M.

In the exemplary embodiment, one end of the metal layer 910 corresponding to the low potential line 812 of the second part may be covered by the planarization layer 930. The other end of the metal layer 910 corresponding to the low potential line 812 of the second part may be covered by the first encapsulation layer 951. One end covered by the planarization layer 930 may be more adjacent to the second display area A2 than the other end.

In the exemplary embodiment, a thickness of the second encapsulation layer 952 is reduced toward the outside direction of the second area on the metal layer 910 corresponding to the low potential line 812.

In the exemplary embodiment, an outside corresponding to a part B of the B-B' cross-section may be protected by a protection member. For example, the protection member may include a configuration having a height which is equal to or larger than a thickness of the B-B' cross-section. The protection member is disposed to be in contact with the part B to suppress foreign materials from entering.

Figure 11:
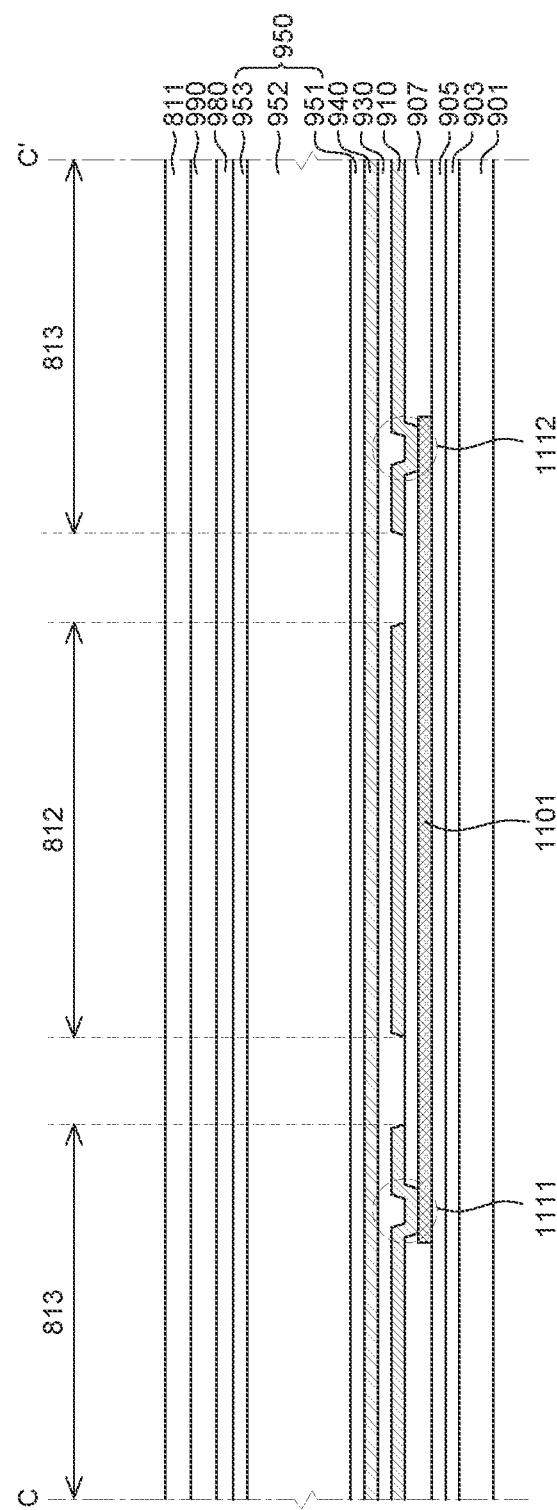
FIG. 11 illustrates a C-C' cross-section of FIG. 8 according to an exemplary embodiment of the present disclosure.

FIG. 11 illustrates a C-C' cross section of FIG. 8 according to one embodiment.

FIG. 11 illustrates an example of a cross-section including a bridge 1101 which connects upper portions of the first display area A1 and the second display area A2 in FIG. 8.

Referring to FIG. 11, the bridge 1101 may be disposed on an active buffer layer 905. The bridge 1101 may be disposed on the same layer as the insulating layer 907. The bridge 1101 may be configured by the same material as a gate electrode (for example, a first gate electrode 213 of FIG. 6 and a second gate electrode 223 of FIG. 7) of a transistor disposed in the pixel circuit.

In the exemplary embodiment, the bridge 1101 may be formed together in a step of forming a gate electrode of a transistor. Thereafter, the insulating layer 907 may be deposited. At least a part of the side surface and the top surface of the bridge 1101 is covered by the insulating layer 907. A part of the top surface of the bridge 1101 is exposed to be in contact with the metal layer 910 disposed on the insulating layer 907. Contact parts of the bridge 1101 and the metal layer 910 may be referred to as contact holes 1111 and 1112. The metal layer 910 which is in contact with the bridge 1101 may correspond to the high potential line 810 through the contact holes 1111 and 1112.

In the exemplary embodiment, the contact holes 1111 and 1112 may be located on both sides of the bridge 1101. The bridge 1101 is connected to the high potential line 813 of the first area (for example, the first area 801 of FIG. 8) and the high potential line 813 of the second area (for example, the second area 802 of FIG. 8) through the contact holes 1111 and 1112. In this case, voltages of the high potential line 813 of the first area and the second area are equal.

In the exemplary embodiment, the contact holes 1111 and 1112 may include a first contact hole 1111 which is connected to the high potential line 813 of the first area and a second contact hole 1112 which is connected to the high potential line 813 of the second area. The first contact hole 1111 is included in the first area and the second contact hole 1112 may be included in the second area.

The insulating layer 907 may be disposed on at least a part of the bridge 1101. The metal layer 910 corresponding to the low potential line 812 may be disposed on at least a part of the insulating layer 907.

In the exemplary embodiment, the high potential line 813 and the low potential line 812 which are disposed on the bridge 1101 may be spaced apart from each other. The planarization layer 930 may be disposed on the high potential line 813 and the low potential line 812.

Figure 12:
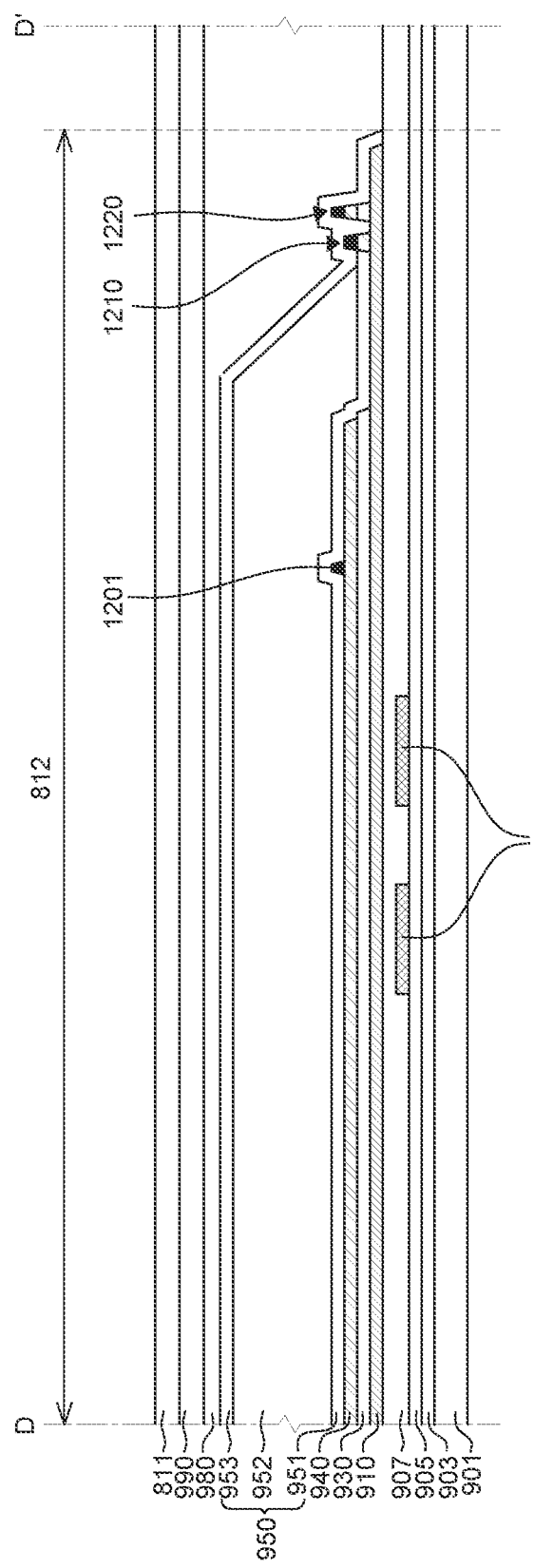
FIG. 12 illustrates a D-D' cross-section of FIG. 8 according to an exemplary embodiment of the present disclosure.

FIG. 12 illustrates a D-D' cross-section of FIG. 8 according to one embodiment.

FIG. 12 illustrates another example of a cross-section including a bridge 1101 which connects upper portions of the first display area A1 and the second display area A2 in FIG. 8. The D-D' cross-section is an example a cross-section perpendicular to the C-C' cross-section.

Referring to FIG. 12, the bridge 1101 may be disposed on an active buffer layer 905. A plurality of bridges 1101 may be disposed. Referring to FIG. 8 together, the bridge 1101 may connect the high potential line 813 above the first display area A1 and the high potential line 813 above the second display area A2, on the plan view. A plurality of bridges 1101 is formed to connect the high potential line 813 above the first display area A1 and the high potential line 813 above the second display area A2.

In FIGS. 8 and 12, an example that two bridges 1101 are implemented is illustrated, but the present disclosure is not limited thereto and more bridges or one bridge may be implemented.

The metal layer 910 illustrated in FIG. 12 may correspond to a low potential line 812. Referring to FIG. 12, the planarization layer 930, the bank layer 940, and the encapsulation member 950 may sequentially be disposed on at least a part of the metal layer 910 which configures the low potential line 812.

According to the exemplary embodiment, a fourth dam 1201 may be disposed on the bank layer 940. The fourth dam 1201 may be disposed along an outer periphery of the display apparatus.

In the exemplary embodiment, the encapsulation member 950 is disposed on at least a part of the metal layer 910 to be in contact therewith. A thickness of the second encapsulation layer 952 of the encapsulation member 950 is thinner toward the outer peripheral direction of the display apparatus. In this case, the first encapsulation layer 951 is disposed on a part of the metal layer 910 and the third encapsulation layer 953 may be disposed on the first encapsulation layer 951 to be in contact therewith.

In the exemplary embodiment, at least one dam 1210, 1220 may be disposed on at least a part of the metal layer 910. The at least one dam 1210, 1220 may include a fifth dam 1210 and a sixth dam 1220. The fifth dam 1210 and the sixth dam 1220 may be disposed to be adjacent to one end of the metal layer 910 and to be in contact with the metal layer 910. One end of the metal layer 910 is covered by at least one of the first encapsulation layer 951 and/or the third encapsulation layer 953. The third encapsulation layer 953 may be covered by the adhesive layer 980.

In the exemplary embodiment, the fifth dam 1210 may have a structure in which the bank layer 940 and the spacer are sequentially laminated. The sixth dam 1220 may have a structure in which the planarization layer 930, the bank layer 940, and the spacer are sequentially laminated. The sixth dam 1220 may be disposed at an outside more than the fifth dam 1210. A height of the sixth dam 1220 is higher than a height of the fifth dam 1210.

In the exemplary embodiment, the outermost area in which the metal layer 910 is not disposed may be disposed on the insulating layer 907 to be in contact with the adhesive layer 980. An outer periphery corresponding to the D' part of the D-D' cross-section is protected by the protection member. For example, the protection member may include a configuration having a height which is equal to or larger than a thickness of the D-D' cross-section. The protection member is disposed to be in contact with the part D' to suppress foreign materials from entering.

The exemplary embodiments of the present disclosure can also be described as follows:

According to an aspect of the present disclosure, there is provided a display apparatus. The display apparatus includes a first area which includes a first display area with a first size, a second area which includes a second display area with a second size, a low potential line which is disposed at outer peripheries of the first area and the second area and between the first area and the second area and supplies a low potential power voltage to a pixel circuit included in each of the first area and the second area and a cover glass which is disposed on the first area, the low potential line, and the second area.

A dummy pixel and a gate driving circuit may be disposed between the first display area and the low potential line, and between the second display area and the low potential line.

A high potential line may be disposed above and below each of the first display area and the second display area.

The high potential line may include a first high potential line disposed above the first display area and a second high potential line disposed above the second display area, and the display apparatus may further include a bridge which connects the first high potential line and the second high potential line, The first area may further include a first contact hole through which the bridge and the first high potential line are connected, and the second area may further include a second contact hole through which the bridge and the second high potential line are connected.

A part of the low potential line disposed between the first area and the second area may extend along one end of the second area.

Each of the first area and the second area may include a substrate, an insulating layer disposed over the substrate, an electrode layer disposed over the insulating layer, a planarization layer disposed over the electrode layer, a bank layer disposed over the planarization layer, a first encapsulation layer disposed over the bank layer, a second encapsulation layer disposed over the first encapsulation layer and a third encapsulation layer disposed over the second encapsulation layer, and one end of the low potential line extending along one end of the second area may be covered by the first encapsulation layer and the other end may be covered by the planarization layer.

Each of the first area and the second area may further include a pad in which a data driving circuit is disposed and a data line and a high potential line extending from the pad, and a part of the low potential line disposed between the first area and the second area may extend along one end of the second area and the other part may extend to be disposed between a pad of the first area and the high potential line of the first area, and a part of the low potential line and the other part may extend to be perpendicular to each other.

At least one dam may be disposed on the low potential line extending along one end of the second area and the first encapsulation layer may be disposed on at least one dam.

A 1-1-th lens may be disposed on each of a plurality of organic light emitting diodes disposed in the first area, a 1-2-th lens may be disposed on one of the plurality of organic light emitting diodes disposed in the second area, and a second lens having a different shape from the second 1-2-th lens may be disposed on the other one.

The 1-1-th lens and the 1-2-th lens may have a rectangular shape and the second lens may have a circular shape.

The 1-1-th lens may be larger than the 1-2-th lens.

According to an aspect of the present disclosure, there is provided a display panel. The display panel includes a first area which includes a first display area with a first size, a second area which includes a second display area with a second size and a low potential line which is disposed at outer peripheries of the first area and the second area and between the first area and the second area and supplies a low potential power voltage to a pixel circuit included in each of the first area and the second area, a cover glass may be disposed on the first area, the low potential line, and the second area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus, comprising:
a first area including a first display area having a first size;
a second area including a second display area having a second size;
a low potential line at least partially surrounding outer peripheries of the first area and the second area and between the first area and the second area in a plan view of the display apparatus, the low potential line supplying a low potential power voltage to a pixel circuit included in each of the first area and the second area that is less than a high potential power voltage supplied to the pixel circuit;
a first lens disposed over a pixel in the first area;
another first lens and a second lens disposed over a pixel in the second area; and
a cover glass on the first area, the low potential line, and the second area,
wherein a viewing angle of the first area is fixed to correspond to the first lens, and a viewing angle of the second area is selectively changeable to correspond to said another first lens in response to driving of an organic light emitting diode corresponding to said another first lens or to the second lens in response to driving of an organic light emitting diode corresponding to the second lens.

2. The display apparatus according to claim 1, further comprising:
a dummy pixel between the first display area and the low potential line in the plan view; and
a gate driving circuit between the second display area and the low potential line in the plan view.

3. The display apparatus according to claim 2, wherein each of the first area and the second area includes:
a substrate;
an insulating layer over the substrate;
an electrode layer over the insulating layer;
a planarization layer over the electrode layer;
a bank layer over the planarization layer;
a first encapsulation layer over the bank layer;
a second encapsulation layer over the first encapsulation layer; and
a third encapsulation layer over the second encapsulation layer,
wherein a first end of the low potential line extending along one end of the second area is covered by the first encapsulation layer and a second end is covered by the planarization layer.

4. The display apparatus according to claim 3, wherein each of the first area and the second area further includes:
a pad in which a data driving circuit is disposed; and
a data line and a high potential line extending from the pad, and
wherein a first part of the low potential line between the first area and the second area extends along a first end of the second area and a second part of the low potential line extends between the pad of the first area and the high potential line of the first area, and
wherein the first part and the second part of the low potential line are perpendicular to each other.

5. The display apparatus according to claim 3, further comprising:
at least one dam on the low potential line extending along one end of the second area, and the first encapsulation layer is on the at least one dam.

6. The display apparatus according to claim 3, wherein the first area and the second area are implemented on a single display panel, and
wherein a portion of the low potential line is disposed in a boundary region between the first area and the second area.

7. The display apparatus according to claim 6, wherein a side surface and a portion of an upper surface of the portion of the low potential line are covered by the planarization layer, and
wherein another portion of the upper surface of the low potential line is covered by the first encapsulation layer.

8. The display apparatus according to claim 7, wherein the second encapsulation layer and the third encapsulation layer extend into the boundary region between the first area and the second area.

9. The display apparatus according to claim 6, further comprising:
a dam disposed between the portion of the low potential line and the dummy pixel.

10. The display apparatus according to claim 9, wherein the first encapsulation layer covers the dam and extends into the boundary region between the first area and the second area.

11. The display apparatus according to claim 1, further comprising:
a high potential line that is above and below the first display area and the second display area, the high potential line supplying the high potential power voltage to the pixel circuit.

12. The display apparatus according to claim 11, wherein the high potential line includes a first high potential line above the first display area and a second high potential line above the second display area, and the display apparatus further comprises:
a bridge that connects together the first high potential line and the second high potential line.

13. The display apparatus according to claim 12, wherein the first area further includes a first contact hole through which the bridge and the first high potential line are connected, and the second area further includes a second contact hole through which the bridge and the second high potential line are connected.

14. The display apparatus according to claim 1, wherein a part of the low potential line between the first area and the second area extends along one end of the second area.

15. The display apparatus according to claim 1, wherein the first lens is disposed on each of a plurality of organic light emitting diodes disposed in the first area;
said another first lens is disposed on a first organic light emitting diode among the plurality of organic light emitting diodes disposed in the second area; and
the second lens having a different shape from the said another first lens is disposed on a second organic light emitting diode among the plurality of organic light emitting diodes in the second area.

16. The display apparatus according to claim 15, wherein the first lens and said another first lens have a rectangular shape and the second lens has a circular shape.

17. The display apparatus according to claim 16, wherein the first lens is larger than said another first lens.

18. A display apparatus comprising:
- a first display area having a first size, the first display area having a first pixel including a first light emitting element;
- a second display area having a second size that is larger than the first size, the second display area having a second pixel including a second light emitting element and a third light emitting element;
- a first lens overlapping the first light emitting element in the first display area and a second lens overlapping the second light emitting element in the second display area, the first lens and the second lens having a first shape;
- a third lens overlapping the third light emitting element that is included in the second pixel in the second display area, the third lens having a second shape that is different from the first shape; and
- a low potential line between the first display area and the second display area in a plan view of the display apparatus, the low potential line supplying a low potential power voltage to the first pixel in the first display area and the second pixel in the second display area that is less than a high potential power voltage supplied to the first pixel and the second pixel.

19. The display apparatus according to claim 18, wherein the first display area has a first viewing angle that is fixed and the second display area has a variable viewing angle that switches between the first viewing angle and a second viewing angle that is less than the first viewing angle.

20. The display apparatus according to claim 19, wherein the first lens and the second lens each respectively supply light from the first light emitting element and the second light emitting element at the first viewing angle, and the third lens supplies light from the third light emitting element at the second viewing angle that is less than the first viewing angle.

21. The display apparatus according to claim 20, wherein the first display area displays a first type of content and the second display area displays a second type of content that is different from the first type of content.

22. The display apparatus according to claim 21, wherein the first type of content includes attributes of a vehicle that include the display apparatus and the second type of content includes entertainment content.

23. The display apparatus according to claim 22, wherein during a first mode the entertainment content is displayed in the second display area via the third light emitting element and the third lens but not the second light emitting element and the second lens, and during a second mode the entertainment content is displayed in the second display area via the second light emitting element and the second lens but not the third light emitting element and the third lens.

24. The display apparatus according to claim 18, wherein the low potential line at least partially surrounds outer peripheries of the first display area and the second display area.

25. The display apparatus according to claim 18, further comprising:
- a cover glass on the first display area, the second display area, and the low potential line.

26. The display apparatus according to claim 18, further comprising:
- a dummy pixel between the first display area and the low potential line in the plan view; and
- a gate driving circuit between the second display area and the low potential line in the plan view.

27. The display apparatus according to claim 18, further comprising:
- a high potential line that is above the first display area and the second display area and is below the first display area and the second display area, the high potential line supplying the high potential power voltage to the first pixel and the second pixel.

28. The display apparatus according to claim 27, wherein the high potential line includes a first high potential line above the first display area and a second high potential line above the second display area, and the display apparatus further comprises:
- a bridge that connects together the first high potential line and the second high potential line.

29. The display apparatus according to claim 18, wherein each of the first display area and the second display area includes:
- a substrate;
- an insulating layer over the substrate;
- an electrode layer over the insulating layer;
- a planarization layer over the electrode layer;
- a bank layer over the planarization layer;
- a first encapsulation layer over the bank layer;
- a second encapsulation layer over the first encapsulation layer; and
- a third encapsulation layer over the second encapsulation layer,
- wherein a first end of the low potential line extending along one end of the second display area is covered by the first encapsulation layer and a second end is covered by the planarization layer.

30. The display apparatus according to claim 29, wherein each of the first display area and the second display area further includes:
- a pad in which a data driving circuit is disposed; and
- a data line and a high potential line extending from the pad, and
- wherein a first part of the low potential line between the first display area and the second display area extends along a first end of the second display area and a second part of the low potential line extends between the pad of the first display area and the high potential line of the first display area, and
- wherein the first part and the second part of the low potential line are perpendicular to each other.

* * * * *